(12) United States Patent
Chang et al.

(10) Patent No.: US 8,284,597 B2
(45) Date of Patent: Oct. 9, 2012

(54) DIODE MEMORY

(75) Inventors: Kuo-Pin Chang, Yuanli Township (TW); Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 222 days.

(21) Appl. No.: 12/904,792

(22) Filed: Oct. 14, 2010

(65) Prior Publication Data

US 2011/0273930 A1 Nov. 10, 2011

Related U.S. Application Data

(60) Provisional application No. 61/332,134, filed on May 6, 2010.

(51) Int. Cl.
*G11C 11/36* (2006.01)
(52) U.S. Cl. ............... 365/175; 365/158; 365/189.14
(58) Field of Classification Search ............ 365/171, 365/173, 175, 158, 189.04, 189.14
See application file for complete search history.

(56) References Cited

U.S. PATENT DOCUMENTS

| | | | |
|---|---|---|---|
| 6,385,075 B1 | 5/2002 | Taussig et al. | |
| 6,636,436 B2 * | 10/2003 | Perner | 365/158 |
| 6,937,528 B2 | 8/2005 | Hush et al. | |
| 7,057,202 B2 | 6/2006 | Ashton et al. | |
| 7,105,870 B2 | 9/2006 | Lee et al. | |
| 7,112,484 B2 | 9/2006 | Gilton | |
| 7,151,008 B2 | 12/2006 | Ashton et al. | |
| 7,307,268 B2 | 12/2007 | Scheuerlein | |
| 7,335,906 B2 | 2/2008 | Toda | |
| 7,379,317 B2 | 5/2008 | Bill et al. | |
| 7,382,664 B2 * | 6/2008 | Le Phan | 365/189.04 |
| 7,408,212 B1 | 8/2008 | Luan et al. | |
| 7,433,222 B2 * | 10/2008 | Hosoi et al. | 365/148 |
| 7,450,416 B1 | 11/2008 | Kaza et al. | |
| 7,453,755 B2 | 11/2008 | Cleeves | |
| 7,476,945 B2 | 1/2009 | Yamada | |
| 7,508,050 B1 | 3/2009 | Pei et al. | |
| 7,521,281 B2 | 4/2009 | Lee et al. | |
| 7,539,040 B2 | 5/2009 | Tamai et al. | |
| 7,570,511 B2 | 8/2009 | Cho et al. | |
| 7,618,850 B2 | 11/2009 | Kumar et al. | |
| 7,659,561 B2 | 2/2010 | Kwon | |
| 7,705,388 B2 | 4/2010 | Iwata | |
| 7,706,177 B2 | 4/2010 | Petti | |
| 7,723,723 B2 | 5/2010 | Yamada | |
| 7,733,685 B2 | 6/2010 | Scheuerlein et al. | |
| 7,755,934 B2 | 7/2010 | Toda et al. | |
| 2009/0185411 A1 | 7/2009 | Happ et al. | |
| 2010/0047995 A1 | 2/2010 | Apodaca et al. | |
| 2011/0002155 A1 * | 1/2011 | Arita et al. | 365/148 |

OTHER PUBLICATIONS

U.S. Appl. No. 12/430,290, filed Apr. 27, 2009, entitled Integrated Circuit 3D Memory Array and Manufacturing Method by inventors Hsiang-Lan Lung and Hang-Ting Lue, consisting of 44 pages.
U.S. Appl. No. 12/755,325, filed Apr. 6, 2010, entitled Integrated Circuit 3D Memory Array and Manufacturing Method by inventor Hsiang-Lan Lung consisting of 37 pages.

* cited by examiner

*Primary Examiner* — Gene Auduong
(74) *Attorney, Agent, or Firm* — Kenta Suzue; Haynes Beffel & Wolfeld LLP

(57) ABSTRACT

A diode memory device has an intermediate structure between the two terminals, such as a p terminal and the n terminal.

20 Claims, 27 Drawing Sheets

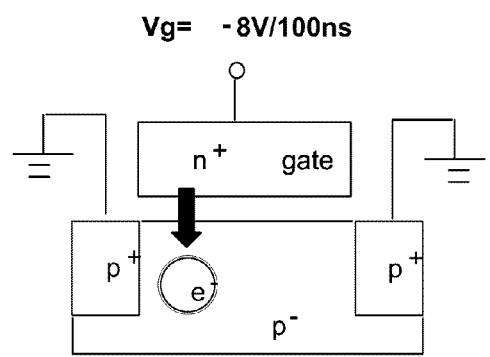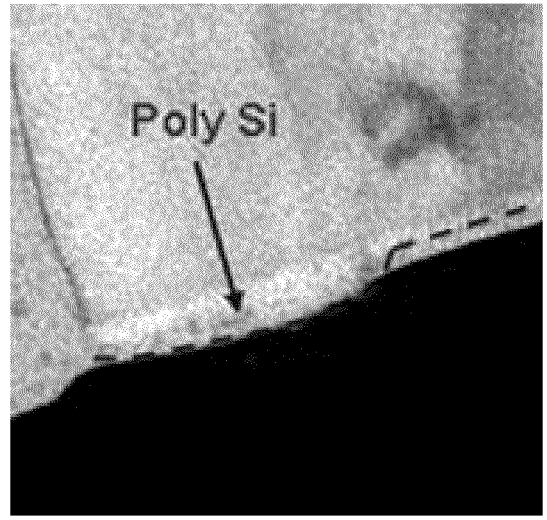
Fig. 9A
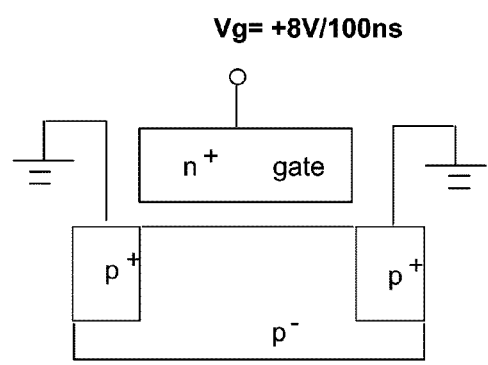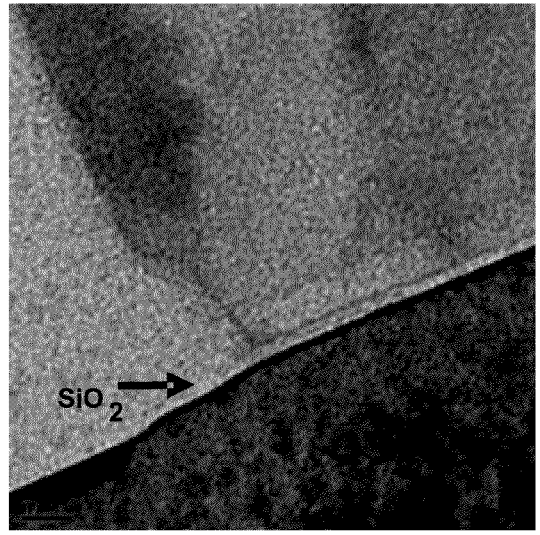
Fig. 9B

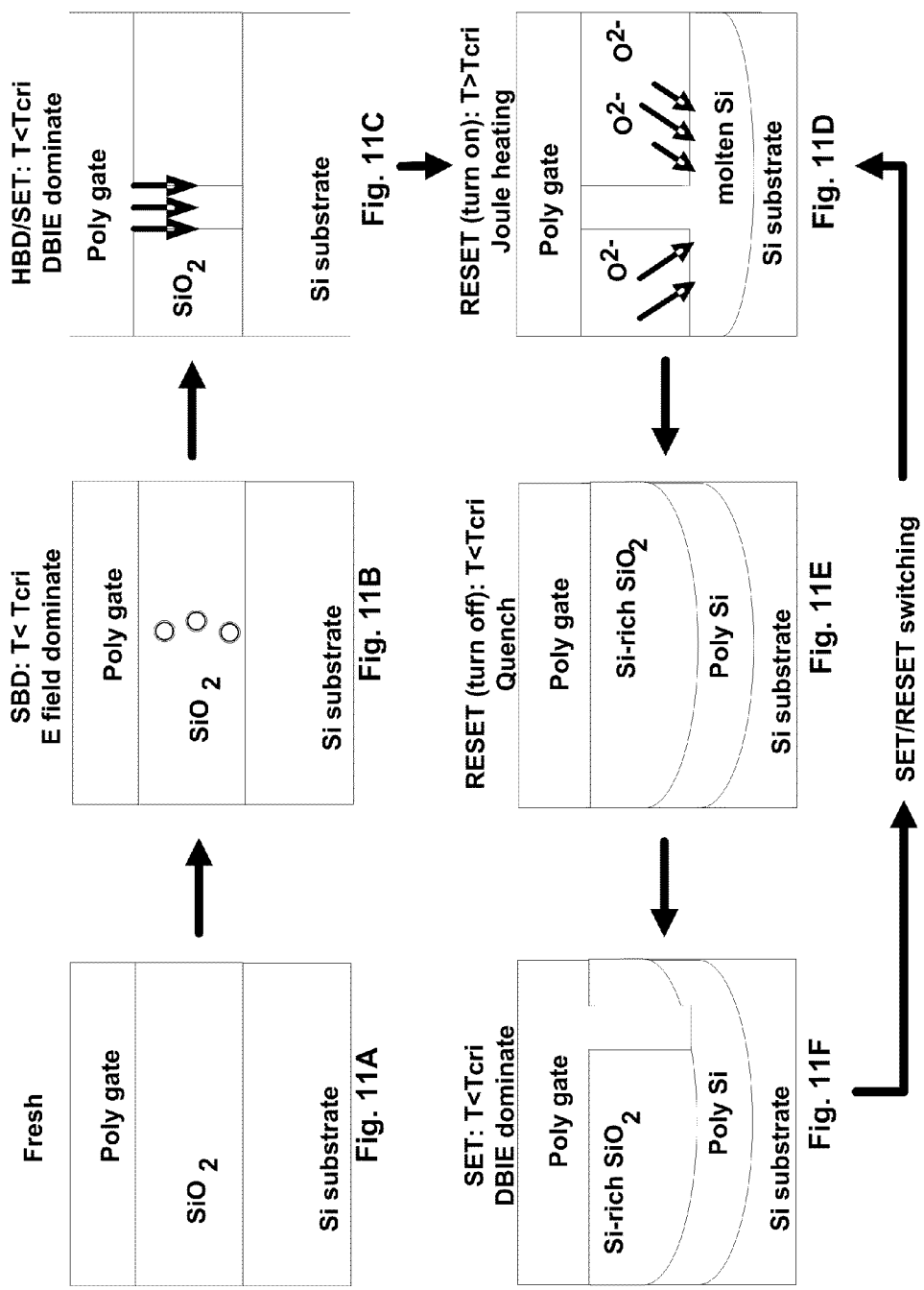

DIODE MEMORY

RELATED APPLICATIONS

This application claims the benefit under 35 U.S.C. §119 (e) of U.S. Provisional Application No. 61/332,134, filed on 6 May 2010, which is incorporated herein by reference.

BACKGROUND

1. Field of the Invention

This technology relates to a diode memory device.

2. Description of Related Art

SiO2 antifuse memories are usually designed for one-time program (OTP). An extra diode or selecting transistor is needed to access a specific memory cell in a memory array. Similarly, resistive random-access memory generally needs an extra diode or selecting transistor to access a specific memory cell in a memory array, and to block access to unselected memory cells in a memory array.

Although such extra access devices remain necessary to select a specific memory cell from an array of memory cells, such extra access devices limit memory device scalability and increase fabrication complexity.

SUMMARY

One embodiment is a diode memory device, with an intermediate structure between the p terminal and the n terminal. The intermediate structure is the storage node and the diode formed in-situ is the isolation device. The isolation device blocks access to unselected diode memory devices. An example of the intermediate structure is SiO2, which shows extraordinary memory switching properties, by punching through the gate oxide (e.g., of a MOS capacitor). The device is unipolar in the substrate, unlike a transistor. Other intermediate structures include metal oxide material(s), high-k material(s), SiN, and SiON, all of varying stoichiometry, and resistance-based materials to form resistance-based devices.

Unlike antifuse memories, the diode memory device does not require additional isolation and access devices such as an additional diode or additional transistor. Accordingly, the diode is a 0T-1R device (no transistor, single resistor).

Another embodiment is an array of diode memory devices, such as on an integrated circuit.

Another embodiment is a method of operating the diode memory device, such as read, set, or reset operations.

Another embodiment is a method of operating an array of diode memory devices, such as addressing a selected diode memory device or selected diode memory devices, and then performing read, set, or reset operations.

Another embodiment is manufacturing a diode memory device or an array of diode memory devices, such as performing the initial breakdown operations prior to regular memory operations such as reset and set operations.

One aspect of the technology is an integrated circuit apparatus with a cross-point array and control circuitry.

The cross-point array includes a plurality of bit lines and a plurality of word lines. Intersections of the plurality of bit lines and the plurality of word lines include diode memory devices. The diode memory devices include a diode and a memory element.

The diode includes a first terminal electrically coupling a bit line of the plurality of bit lines and a second terminal electrically coupling a word line of the plurality of word lines. The memory element is between the first terminal and the second terminal of the diode. The memory element is bidirectionally switchable between a first memory state and a second memory state.

The diodes of the diode memory devices reduce current through unselected intersections of the intersections of the plurality of bit lines and the plurality of word lines.

The control circuitry is coupled to the cross-point array. The control circuitry applies bias arrangements to a selected intersection of the intersections of the plurality of bit lines and the plurality of word lines that bidirectionally switch the memory element of the diode memory device at the selected intersection.

In one embodiment, the first terminal is in a doped well and the second terminal is part of the word line. In one embodiment, the doped well has a first doping type at a first concentration, and the diode memory device further includes a doping region having the first doping type in the well. The doping region is positioned under the memory element and has a second concentration less than the first concentration. In one embodiment, such light channel doping is used to perform high ON/OFF ratio of diode, and its implanted depth helps the RESET operation. Channel-doping depth is away the Si surface (for example, 1200 A depth). Si near the surface, with high resistance (undoped or very light doping), is the region of melting the Si (in our case, Si material is used for switching); then oxygen atoms form surrounding layer quickly and easily diffuse into molten Si and form SiO2 after quench.

In one embodiment, the memory element includes silicon oxide.

In one embodiment, the memory element includes a first silicon oxide layer, a silicon nitride layer over the first silicon oxide layer, and a second silicon oxide layer over the silicon nitride layer. An example is a SONOS device.

In one embodiment, the memory element includes any of a metal oxide, silicon nitride, silicon oxynitride, programmable resistive material, and a material with a dielectric constant larger than a silicon oxide dielectric constant.

In one embodiment, the diode memory devices further include at least one of: (i) an upper buffer layer between the first terminal and the memory element; and (ii) a lower buffer layer between the second terminal and the memory element.

In one embodiment, the control circuitry applies a first forward bias arrangement with a first set of electrical characteristics to the selected intersection that switches the memory element of the diode memory device at the selected intersection from the first memory state to the second memory state. And, the control circuitry applies a second forward bias arrangement with a second set of electrical characteristics to the selected intersection that switches the memory element of the diode memory device at the selected intersection from the second memory state to the first memory state.

In one embodiment, the control circuitry switches the memory element of the diode memory device at the selected intersection from the first memory state to the second memory state by causing dielectric breakdown induced epitaxy at the memory element. And, the control circuitry switches the memory element of the diode memory device at the selected intersection from the second memory state to the first memory state by causing Joule heating at the memory element.

In one embodiment, the first memory state corresponds to the diode memory device having a first diode current-voltage characteristic, and the second memory state corresponds to the diode memory device having a second diode current-voltage characteristic. The first diode current-voltage characteristic and the second diode current-voltage characteristic have different forward characteristics. For example, the ideality factor n varies. Also, the series resistance Rs can vary.

In one embodiment, the memory element is switchable between at least four memory states including the first memory state and the second memory state.

One aspect of the technology is a method of operating an integrated circuit, including the step:

applying bias arrangements to a selected intersection of intersections of a plurality of bit lines and a plurality of word lines that bidirectionally switch memory states of a memory element of a diode memory device at the selected intersection, wherein the diode memory device includes a diode including a first terminal electrically coupling a bit line of the plurality of bit lines and a second terminal electrically coupling a word line of the plurality of word lines, and a memory element between the first terminal and the second terminal of the diode, and current through unselected intersections of the intersections of the plurality of bit lines and the plurality of word lines is reduced by the diode of the diode memory device at the unselected intersections.

One embodiment further comprises:

prior to regular operation of the diode memory device, applying an initial bias arrangement to the diode memory device that changes the memory element from an unused state to one of the memory states.

One embodiment further comprises:

prior to regular operation of the diode memory device, applying an initial bias arrangement to the diode memory device that changes the memory element from an unused state having a non-diode current-voltage characteristic to one of the memory states having a diode current-voltage characteristic.

In one embodiment, said applying bias arrangements includes:

applying a first forward bias arrangement with a first set of electrical characteristics to the selected intersection that switches the memory element of the diode memory device at the selected intersection from a first memory state to a second memory state, and applying a second forward bias arrangement with a second set of electrical characteristics to the selected intersection that switches the memory element of the diode memory device at the selected intersection from the second memory state to the first memory state.

In one embodiment, said applying bias arrangements includes:

switching the memory element of the diode memory device at the selected intersection from a first memory state to a second memory state by causing dielectric breakdown induced epitaxy at the memory element, and switching the memory element of the diode memory device at the selected intersection from the second memory state to the first memory state by causing Joule heating at the memory element.

In one embodiment, the first memory state corresponds to the diode memory device having a first diode current-voltage characteristic, and the second memory state corresponds to the diode memory device having a second diode current-voltage characteristic, wherein the first diode current-voltage characteristic and the second diode current-voltage characteristic have different forward characteristics.

In one embodiment, said applying bias arrangements switch the memory element among between memory states having different diode current-voltage characteristics.

In one embodiment, said applying bias arrangements switch the memory element among at least four memory states.

One aspect of the technology is an integrated circuit apparatus with a diode memory device and control circuitry.

The diode memory device includes a diode and a memory element. The diode includes a first terminal and a second terminal. The memory element is between the first terminal and the second terminal of the diode. The memory element is bidirectionally switchable between a first memory state and a second memory state.

In some embodiments the first terminal is in a well having a first doping type at a first concentration, a doping region having the first doping type in the well and having a second concentration less than the first concentration.

In other embodiments the diode of the diode memory device reduces current through the diode memory device responsive to a bias arrangement across the diode memory device corresponding to an unselected diode memory device.

The control circuitry is coupled to the diode memory device. The control circuitry applies bias arrangements to the diode memory device that bidirectionally switch the memory element of the diode memory device.

Other embodiments are disclosed herein.

The terms set, reset, and breakdown refer to both the operation performed on diode memory, and the state of the diode memory resulting from the operation of the same name; the particular use is clear from context.

BRIEF DESCRIPTION OF THE DRAWINGS

FIG. 9A is a photo of the diode memory device after a hard breakdown from negative gate voltage.

FIG. 9B is a photo of the diode memory device after a positive gate voltage.

FIGS. 11A-11F show the diode memory device at various states.

DETAILED DESCRIPTION

Figure 1:
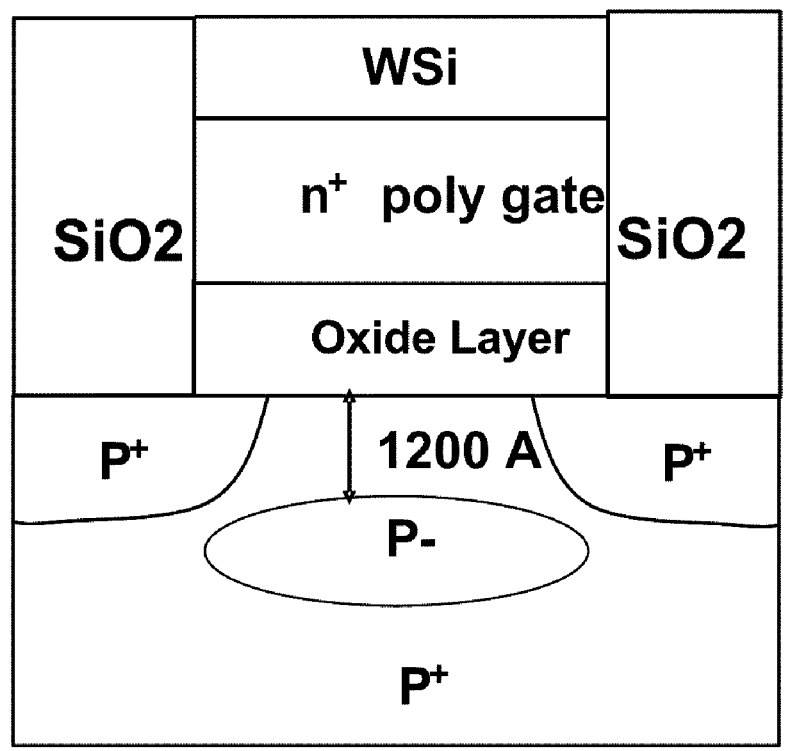
FIG. 1 is a diagram of a diode memory device with an intermediate oxide structure.

FIG. 1 is a diagram of a diode memory device with an intermediate oxide structure.

The structure resembles the conventional MOSFET, but there is no source/drain junctions. Ultra-thin thermal gate oxide of 1.2 nm is deposited in between the N+ poly gate and P− substrate. Pulses are applied at the gate and the gate current is measured. After the gate oxide is ruptured with a forming pulse (1st SET operation), the N+/P junction is formed. A negative gate voltage (−VG) corresponds to the forward read and allows a large current for read and program.

N+ gate doping is around $8 \times 10^{20}$ cm-3. P-channel doping is around $7 \times 10^{17}$ cm-3 with 1200 A depth. Light doping near the surface is helpful for the RESET/SET operations.

There are one or more advantages of this memory which places the memory element inside the diode (SiO2 is a storage node in our case): FEOL process without introducing new materials and processes, self-formed selecting device, after rupturing gate oxide N+/P− diode is automatically formed, very low cost 4F2 0T1R ReRAM device, equivalent scaling with CMOS process.

In contrast, there are one or more disadvantages of alternative memories which place the memory element in series with diode, but not inside the diode, a structure similar to the current RRAM, PCM devices. because the limitation in switching materials (their materials can not be fabricated at FEOL or MEOL) the extra diode or transistor can not in-situ fabricate with switching materials; its process cost is greatly increased; and its process is more complex.

Figure 2:
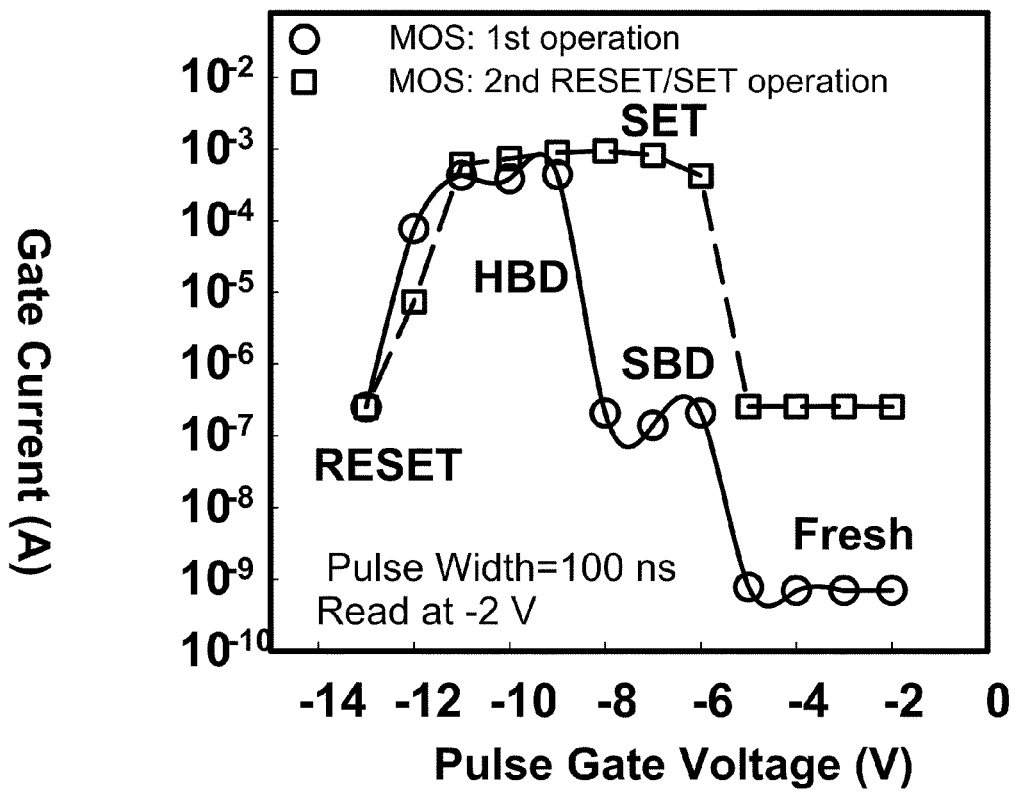
FIG. 2 is a graph of the soft breakdown, hard breakdown, reset, and set operations on the diode memory device of FIG. 1.
Figure 3A:
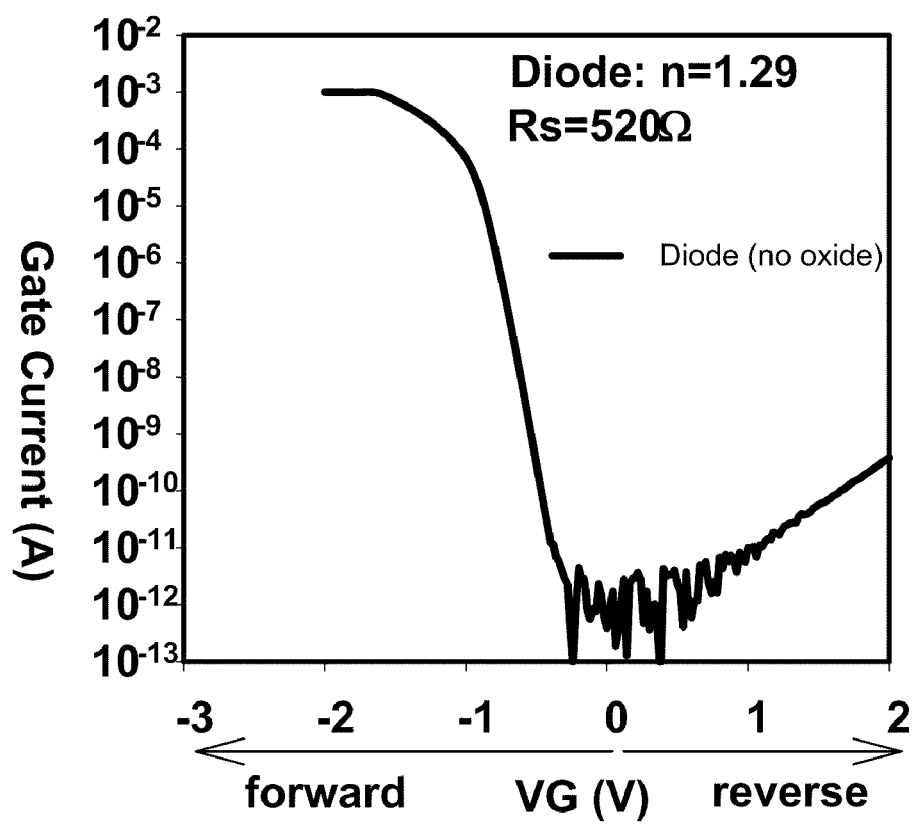
FIGS. 3A-3D are graphs of I-V characteristics of the different states of the diode memory device of FIG. 1.
Figure 3B:
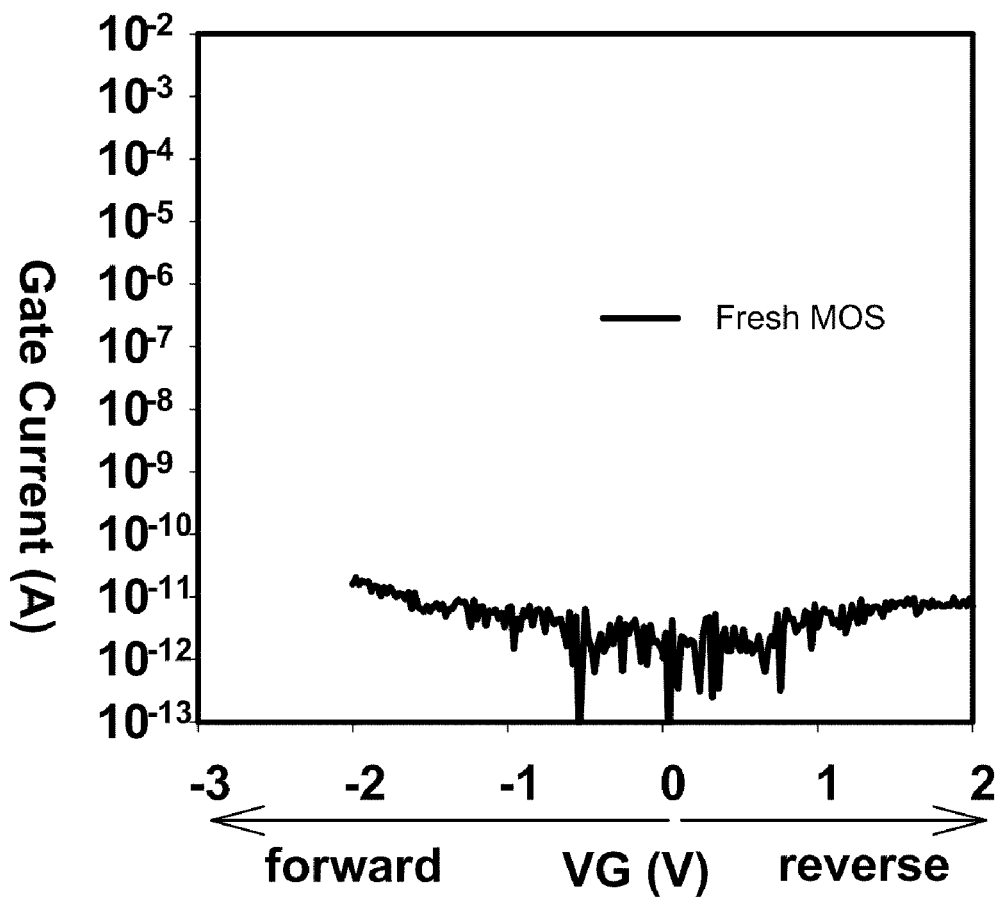
Figure 3C:
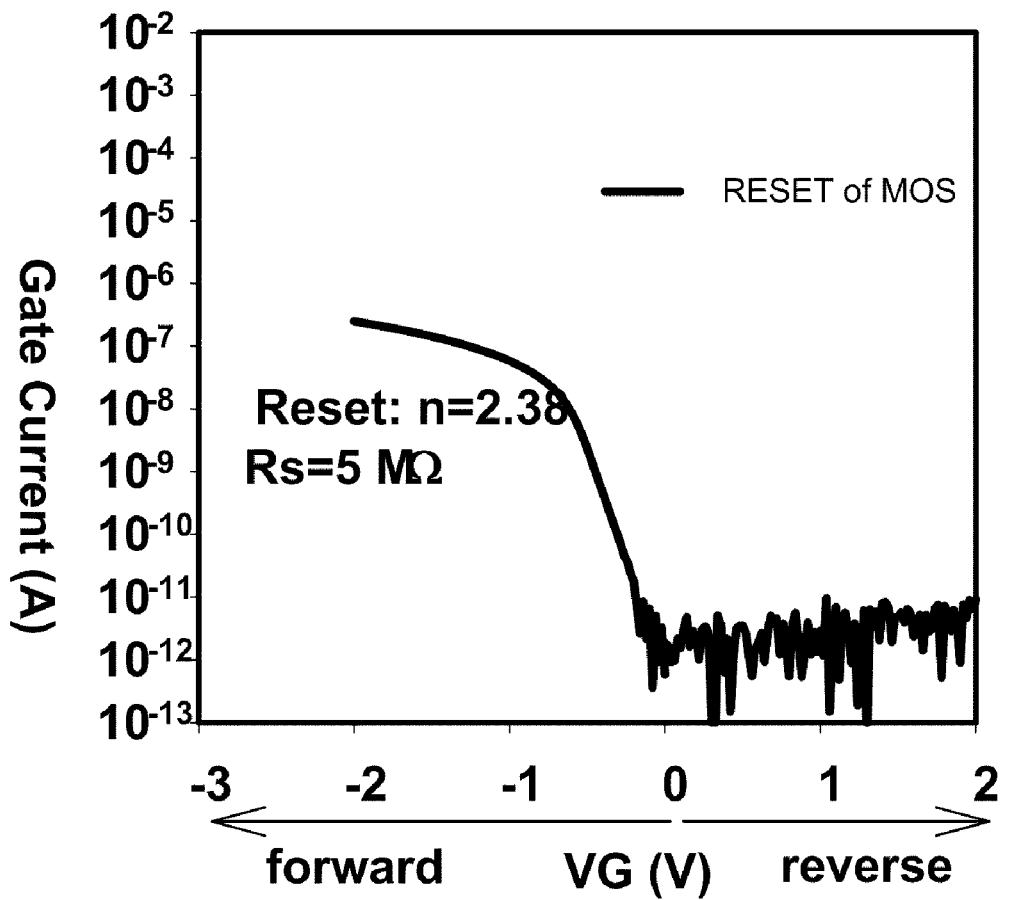
Figure 3D:
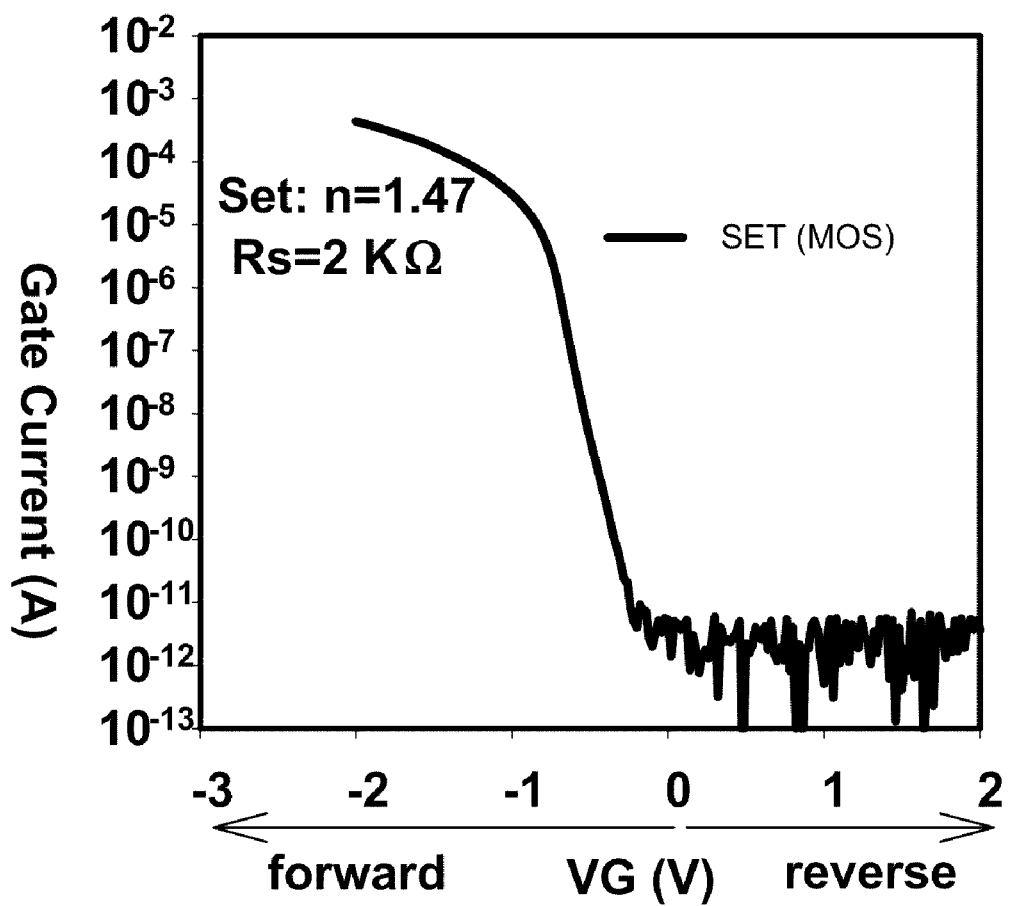

FIG. 2 is a graph of the soft breakdown, hard breakdown, reset, and set operations on the diode memory device of FIG. 1.

For the fresh MOS diode, the negative Vg of 100 ns pulses is gradually increased, until soft breakdown (SBD) at −6V, followed by a hard breakdown (HBD) at −9V. The N+/P junction is formed after the hard breakdown. Interestingly, when Vg is larger than −12V to −13V, the gate current is decreased and the gate resistance is increased ("reset" state). Resistance hysteresis can be repeated by alternately applying −7V (SET operation) pulses and −13V (RESET operation) pulses after the initial forming step. Accordingly, the MOS diode performs a memory switching characteristic. The memory switching relies on changes to the gate current and gate resistance, in lieu of charge storage.

FIGS. 3A-3D are graphs of I-V characteristics of the different states of the diode memory device of FIG. 1. Ideal diode factors n are also extracted.

Because of the N-type gate, a negative gate voltage (−VG) corresponds to the forward read, and allows a large current for read and program.

A fresh MOS diode (FIG. 3B) has negligible gate currents, and demonstrates behavior similar to a resistor. After 1st HBD or SET operation (forming) (FIG. 3D), forward current is increased while reverse current stays low, providing a large ON/OFF ratio (>8 orders) typical of a PN diode. This large ratio supports the "self-selected" diode operation in a cross-point memory array without additional selection devices such as a diode or transistor. There is no need to fabricate a separate isolation device because this diode is formed in-situ, ideal for a low cost cross-point memory array.

RESET operation (FIG. 3C) greatly lowers the forward current and thus allows nearly 3-orders magnitude sensing margin. For comparison, a pure PN diode (FIG. 3A) without intermediate gate oxide is fabricated and measured. FIG. 3 indicates that the SET state read current approaches the PN diode, and the extracted ideal factor (n) is also close to each other (~1.3 to 1.4). Both RESET and SET states show diode rectifying characteristics, such that a separate access/isolation device is not needed in a cross-point array of diode memory devices.

An example of a cross-point array is a NAND-like array. Another example of a cross-point array has a 2 dimensional array of X-Y addressed memory. High density memory includes the diode memory device with an area of 4F2, where F is the minimum feature size. Another embodiment includes multiple stacked arrays of cross-point memory.

Figure 4:
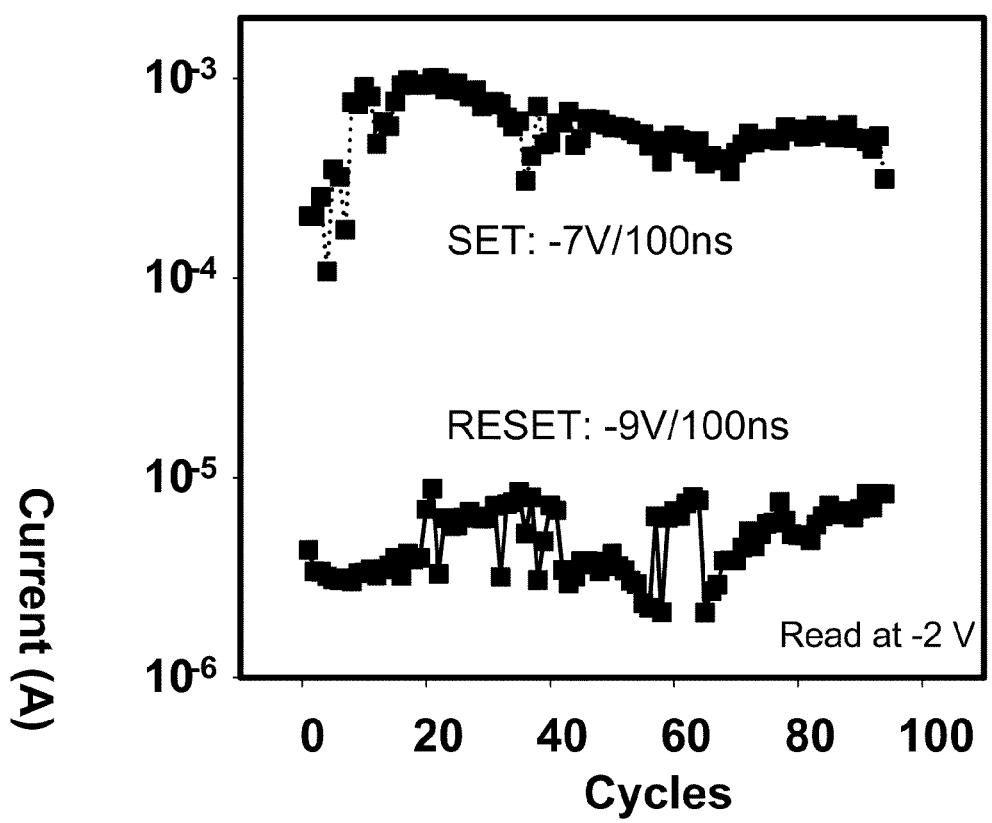
FIG. 4 is a graph showing cycling of the diode memory device of FIG. 1.

FIG. 4 is a graph showing cycling of the diode memory device of FIG. 1.

The diode memory device is switchable for at nearly a hundred unipolar cycles. The cell is scaled to L=0.13 um and W=0.02 um.

Figure 5:
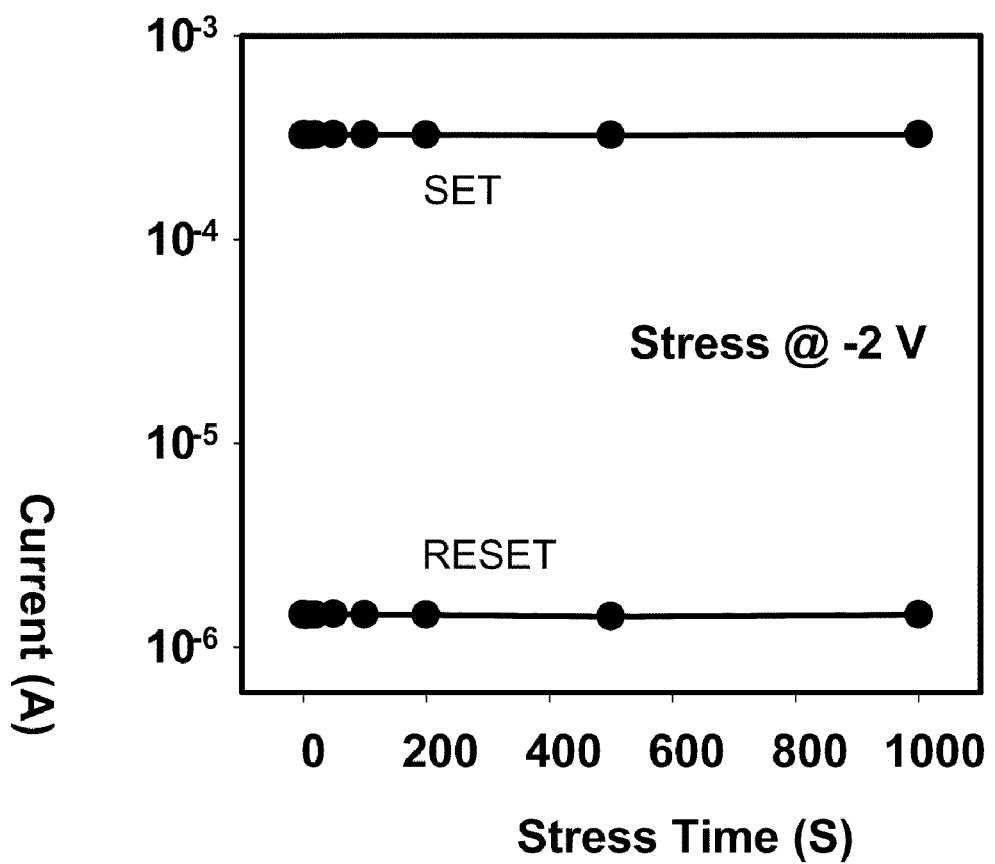
FIG. 5 is a graph showing read disturb immunity of the diode memory device of FIG. 1.

FIG. 5 is a graph showing read disturb immunity of the diode memory device of FIG. 1.

Figure 6:
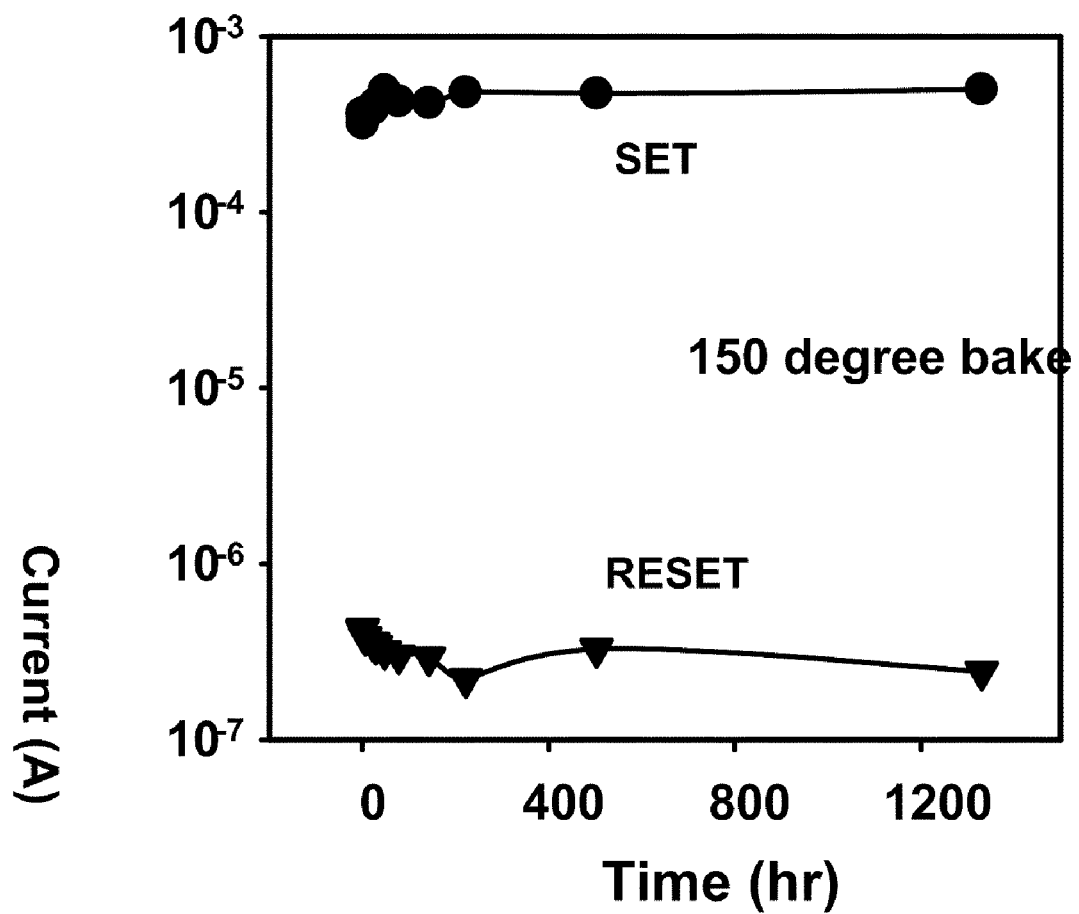
FIG. 6 is a graph showing high temperature retention of the diode memory device of FIG. 1.

FIG. 6 is a graph showing high temperature retention of the diode memory device of FIG. 1.

Both states are stable after more than 1000 hours of 150 degree C. baking

Figure 7:
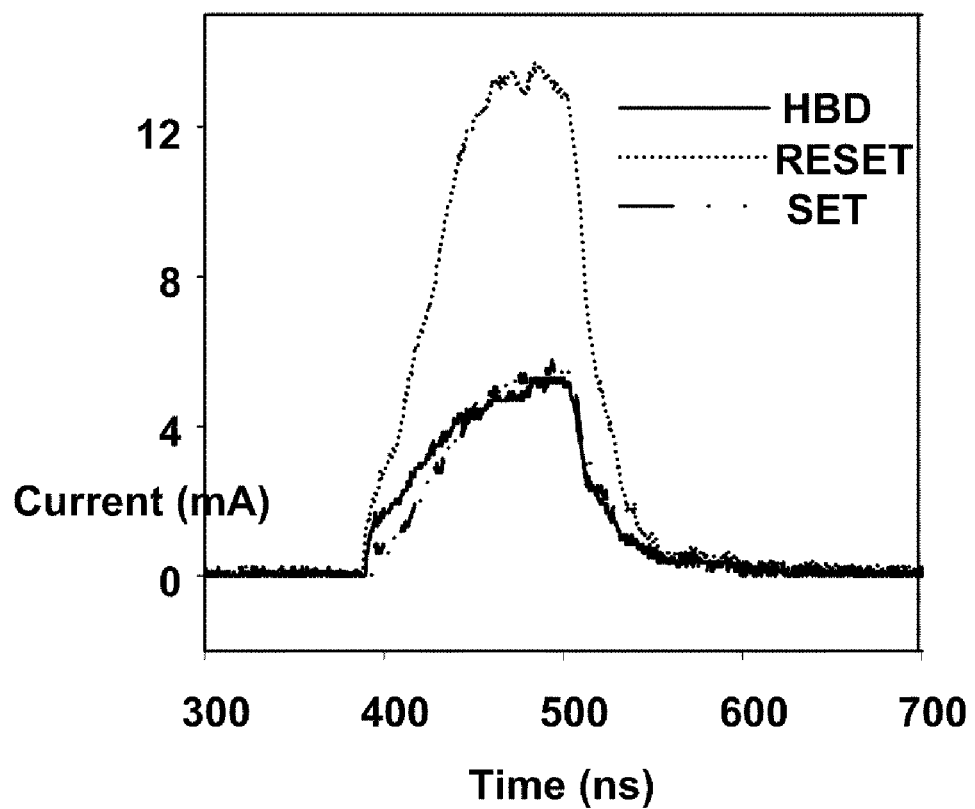
FIG. 7 is a graph showing the transient currents of the different states of the diode memory device of FIG. 1.

FIG. 7 is a graph showing the transient currents of the different states of the diode memory device of FIG. 1 using pulse IV technique.

A programming width of 100 ns is used. RESET operation current is much higher than SET operation current. Device dimensions are L/W=0.2 um/0.2 um.

Figure 8:
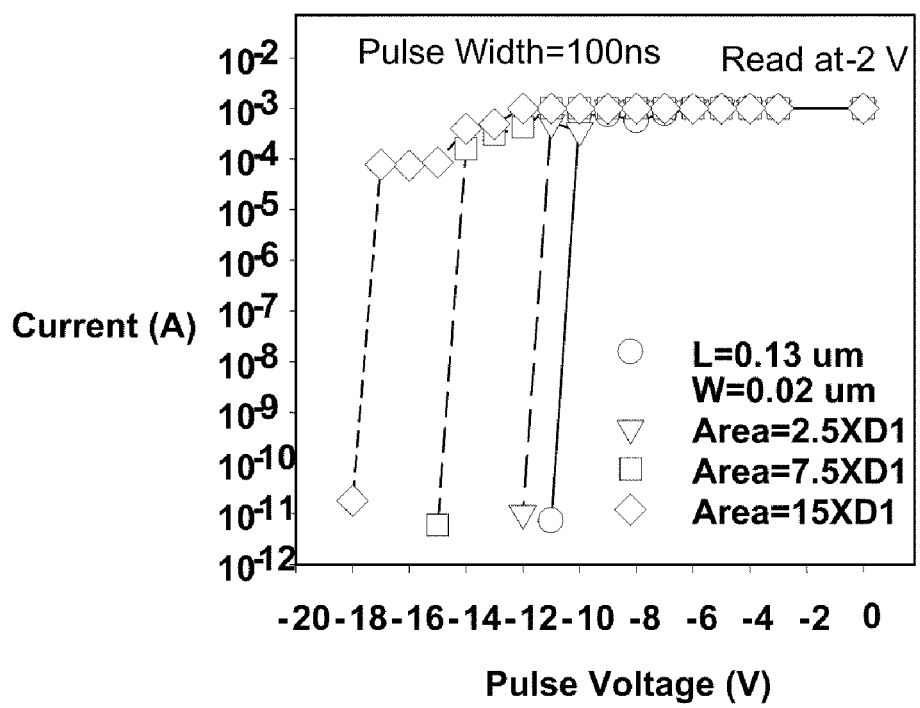
FIG. 8 is a graph showing I-V curves of non-memory diode devices.

FIG. 8 is a graph showing I-V curves of PN diode devices (without intermediate oxide).

The PN diode (without intermediate oxide), with various dimensions, have permanent damage—stuck open—after high voltage stress, without showing signs of switching behavior.

FIG. 9A is a photo of the diode memory device after a hard breakdown from negative gate voltage.

This HBD shows strong voltage polarity dependence and occurs on −Vg stress, for this embodiment with an n+ poly gate. Poly Si from the N+ gate breaks through the thin tunnel oxide after the HBD operation. This phenomenon is known as "dielectric breakdown induced epitaxy" (DBIE).

In another embodiment with a p+ poly gate and n body, the HBD occurs on +Vg stress. In yet another embodiment with a Schottky gate, the polarity depends on whether the Schottky barrier is more similar to the p+ poly gate or n+ poly gate, as determined by the work function and Fermi level of the Schottky metal; compared to the work function, Fermi level, electron affinity, conduction band, and valence band of the semiconductor; with the resulting built-in voltage and Schottky potential barrier.

FIG. 9B is a photo of the diode memory device after a positive gate voltage. No HBD occurs.

Figure 10A:
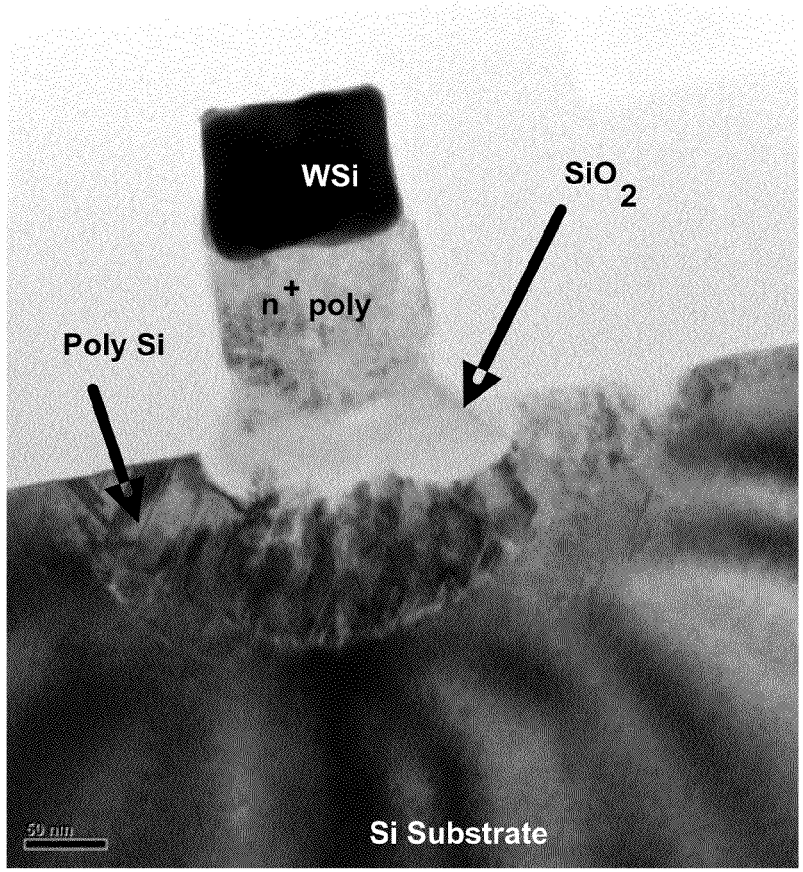
FIG. 10A is a photo of the diode memory device after reset operation.

FIG. 10A is a photo of the diode memory device after reset operation.

Figure 10B:
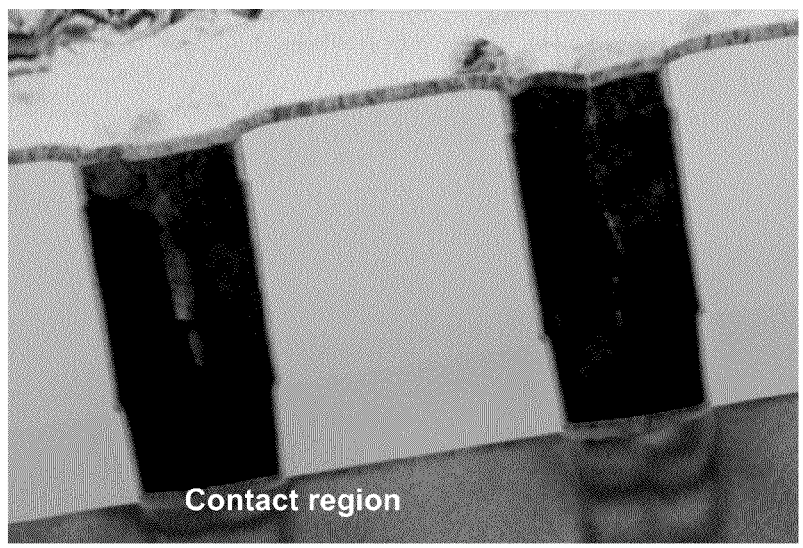
FIG. 10B is a photo of the contact region of the diode memory device after reset operation.

The programming current of the RESET operation causes severe local heating resulting in segregation of a thick SiO2 layer and a poly silicon layer below FIG. 10B is a photo of the contact region of the diode memory device after reset operation.

The TEM images after RESET operation show high programming current causing severe destruction at Si surface. Partial crystalline Si near surface is converted into SiO2 and polysilicon. But the contact region is normal.

Figure 10C:
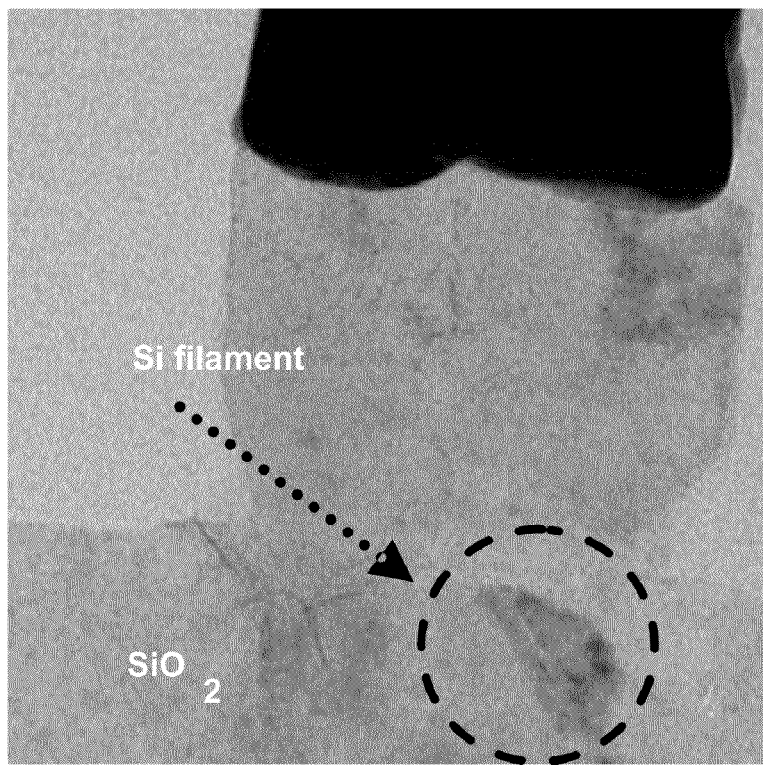
FIG. 10C is a photo of the contact region of the diode memory device after set operation.

FIG. 10C is a photo of the contact region of the diode memory device after set operation.

SET operation causes Si filaments in the oxide.

Figure 10D:
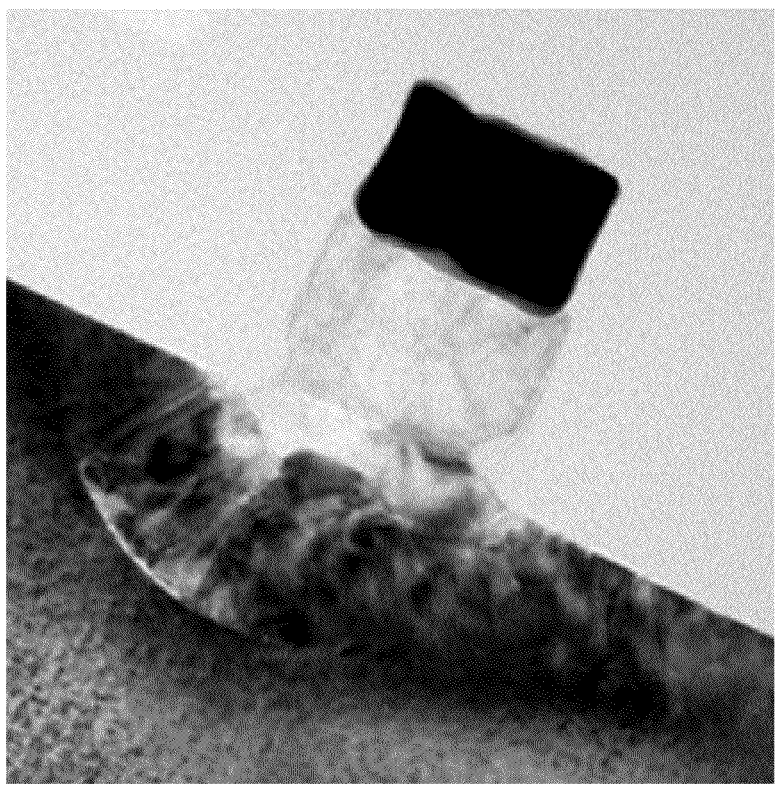
FIG. 10D is a photo of the contact region of the diode memory device after 100 cycles at set state.

FIG. 10D is a photo of the contact region of the diode memory device after 100 cycles at set state.

FIGS. 11A-11E show the diode memory device at various states.

The SBD operation creates percolation paths between the poly gate and the substrate. A percolation path triggers the hard breakdown and the subsequent current causes DBIE. After HBD, further increases in the bias (RESET operation) induce Joule heating near the Si filament. Joule heating dominates RESET operation. Eventually, local temperature approaches the melting point of Si (Tcri, 1685K). Oxygen ions coming from the surrounding layer can easily drift in the molten silicon, and form SiO2 when the current is turned off and temperature is cooled down. Accordingly, SiO2 and partial poly Si are observed at substrate after the RESET operation. This oxide is likely a leaky Si-rich oxide, so that the forward current for RESET state is much higher than fresh state.

SET operation is similar to the first HBD (forming), and requires less current with lower Joule heating and lower temperature in comparison with RESET operation. In SET operation Si atoms are pushed by the high-momentum electron flux, and then atoms are piled up to form Si filaments, similar to electromigration. DBIE dominates SET operation.

Thus SET/RESET operations can be performed repeatedly to form Si filament and SiO2, respectively, giving rise to the memory switching property of the memory diode.

Figure 12A:
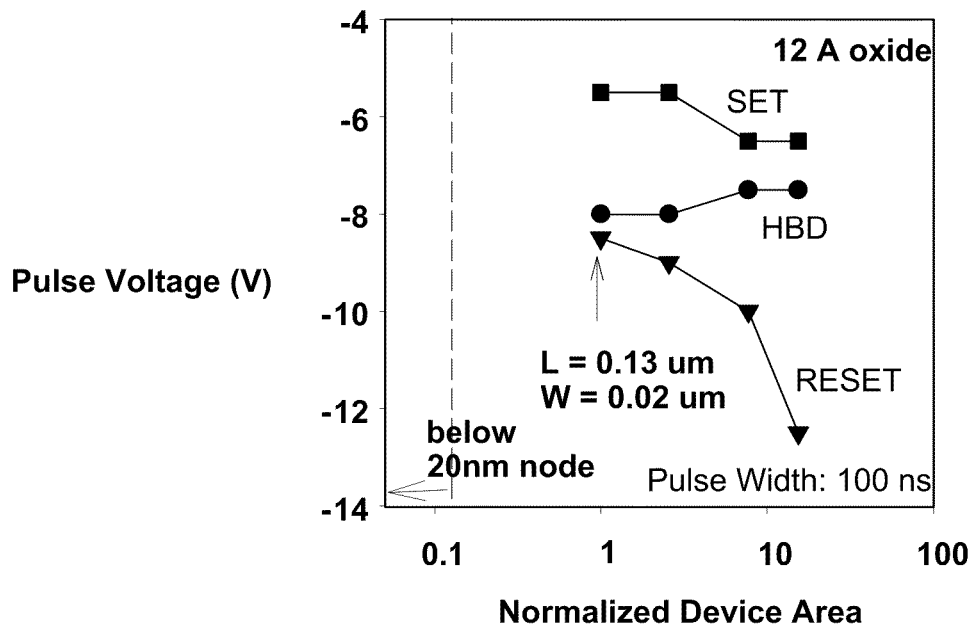
FIG. 12A shows operation voltage versus dimension of a diode memory device of FIG. 1.

FIG. 12A shows operation voltage versus dimension of a diode memory device of FIG. 1.

Figure 12B:
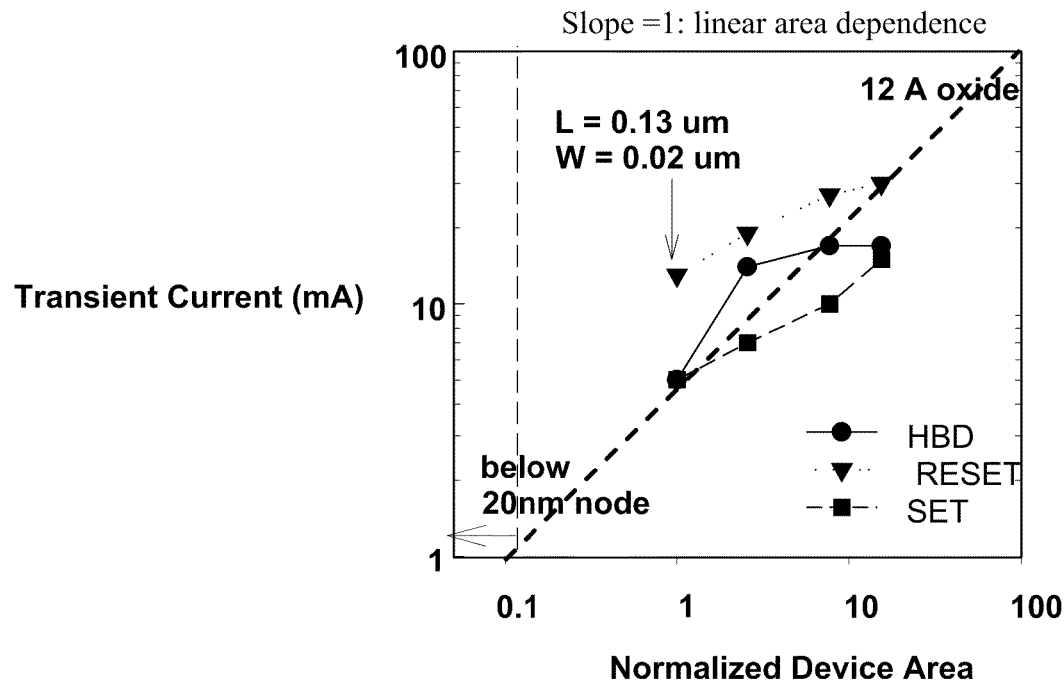
FIG. 12B shows transient current versus dimension of a diode memory device of FIG. 1.

FIG. 12B shows transient current versus dimension of a diode memory device of FIG. 1.

FIGS. 12A and 12B compare the operation voltages and the corresponding operation currents. Devices are scaled down to (L=0.13 um, W=0.02 um), demonstrating high-density storage capability. HBD and SET operation voltages are almost independent of device size. When device size is scaled down, the RESET operation voltage and RESET operation current are decreased. However, the current does not scale linearly with the device area. At 20 nm node, it is forecasted that the RESET operation current is still in the mA range. Because a high power consumption of the Si melting process limits power scaling capability, more effective thermal isolation which reduces the power will support further scaling.

Figure 13:
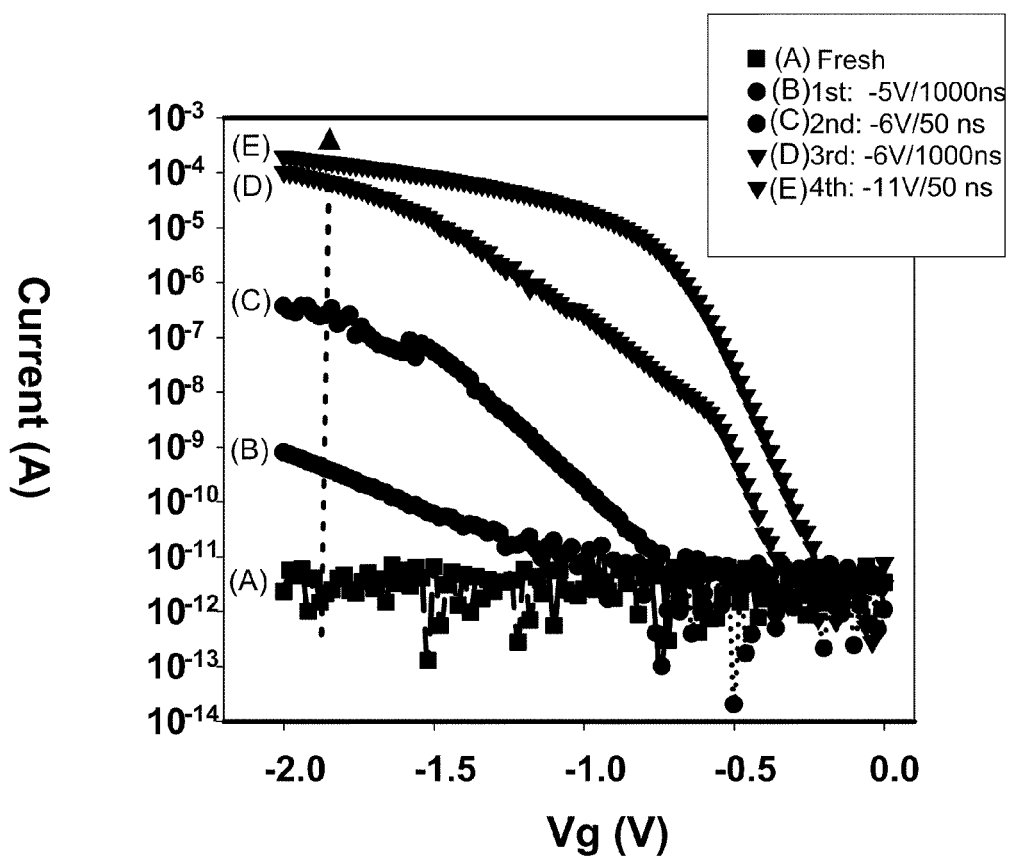
FIG. 13 shows different I-V characteristics of a diode memory device of FIG. 1 after sequential stresses, showing suitability for multiple time programmable applications to store multiple bits on a single diode memory device.

FIG. 13 shows different I-V characteristics of a diode memory device of FIG. 1 after sequential stresses, showing suitability for multiple time programmable applications to store multiple bits on a single diode memory device.

Gate current, related to gate oxide leakage, is tunable by exerting different pulse width/pulse voltage. The initial device is fresh device, acting as a resistor. Then the device is progressively stressed to different current states. The observed progressive breakdown of gate oxide demonstrates suitability for the MTP or MLC application to store multiple bits on a single diode memory device.

As general thin oxide MOSFET are scalable below 10 nm, the diode memory device is scalable below 10 nm. Scalability is improved by the removal of the charge storage problem of storing few electrons, because of the reliance on changes to gate current and gate resistance, in lieu of charge storage, to store data.

Figure 14:
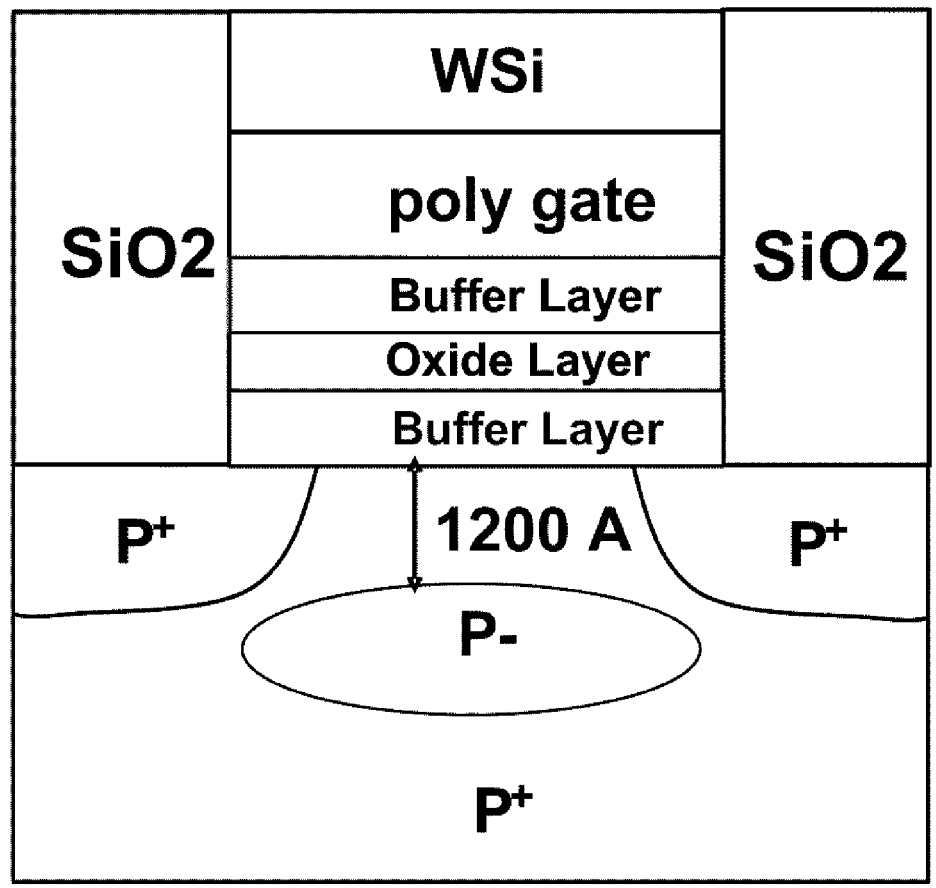
FIG. 14 is a diagram of a diode memory device with an intermediate buffer-oxide-buffer structure.

FIG. 14 is a diagram of a diode memory device with an intermediate buffer-oxide-buffer structure.

Various oxide structures include metal oxide material(s), high-k material(s), SiN, and SiON, all of varying stoichiometry, and resistance-based materials to form resistance-based devices.

Various buffer structures are a semiconductor-like layer, between the oxide structure and the gate, or between the gate and the substrate, or both between the oxide structure and the gate and between the gate and the substrate.

The high-melting point Si and strong bonding $SiO_2$ predominate the HBD/SET/RESET operations, so the transient and pulse voltages are high. Materials other than $Si/SiO_2$ reduce the power consumption, but the "self-selected" property is kept.

Example buffer layers are oxide, phase-change and semiconductor materials.

The can perform rectifying characteristic of PN diode.

Buffer layers are also metals, where the device performs rectifying characteristics of the Schottky diode.

Figure 15:
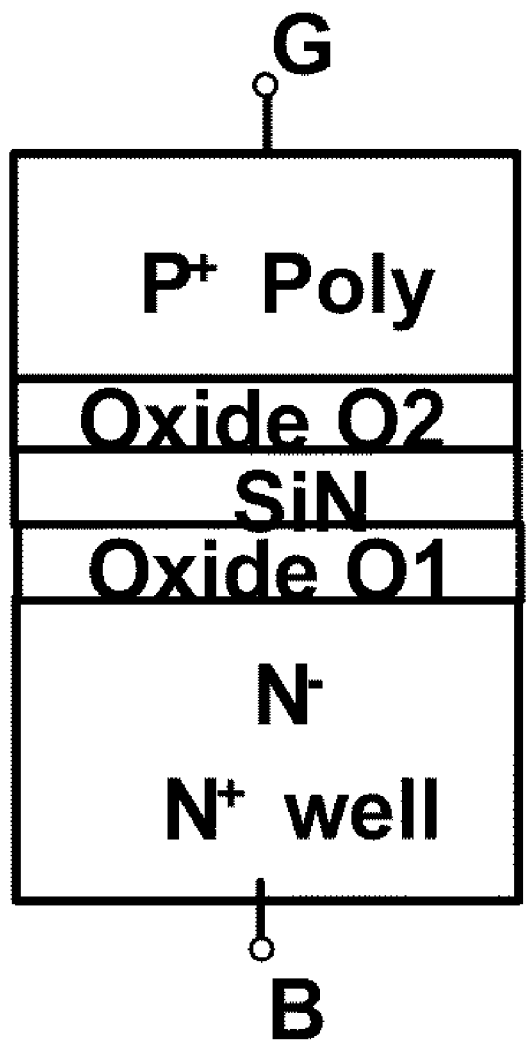
FIG. 15 is a diagram of a diode memory device with an intermediate oxide-nitride-oxide structure.

FIG. 15 is a diagram of a diode memory device with an intermediate oxide-nitride-oxide structure.

In an n+ well, a more lightly doped n− region is close to the surface. The first oxide layer, formed on the n-region, is 11 angstroms thick and formed by the in situ steam generation method. The silicon nitride layer, formed on the first oxide layer, is 20 angstroms thick. The second oxide layer, formed on the silicon nitride layer, is 28 angstroms thick and formed by the high temperature oxide method. Various embodiments differently vary the temperatures, thicknesses, and materials.

Figure 16:
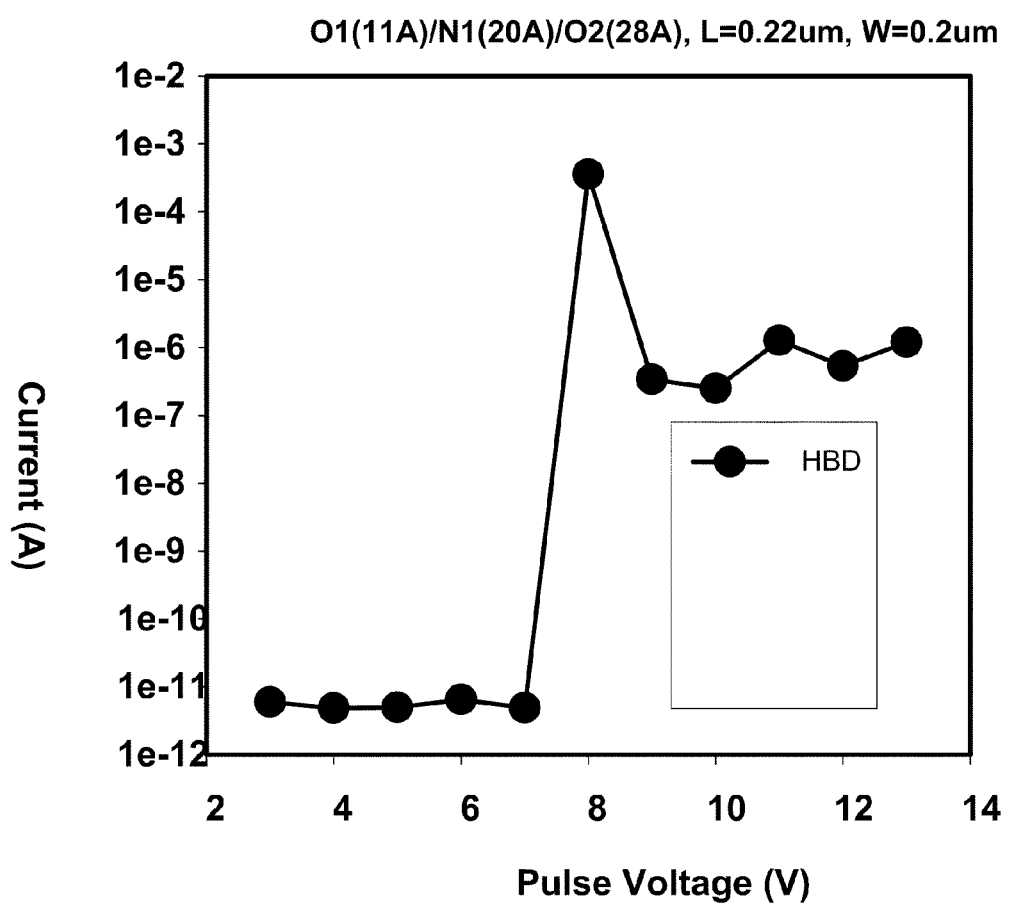
FIGS. 16-18 is a graph of the hard breakdown, reset, and set operations on the diode memory device of FIG. 15.
Figure 17:
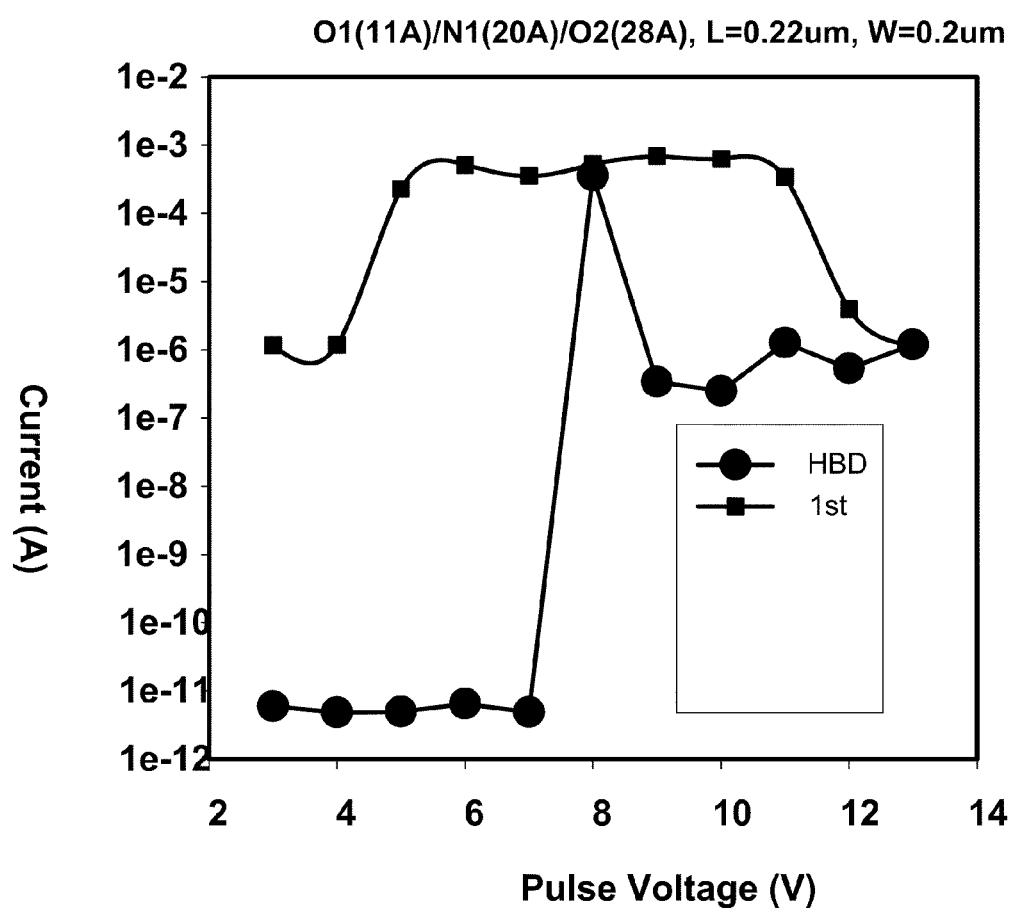
Figure 18:
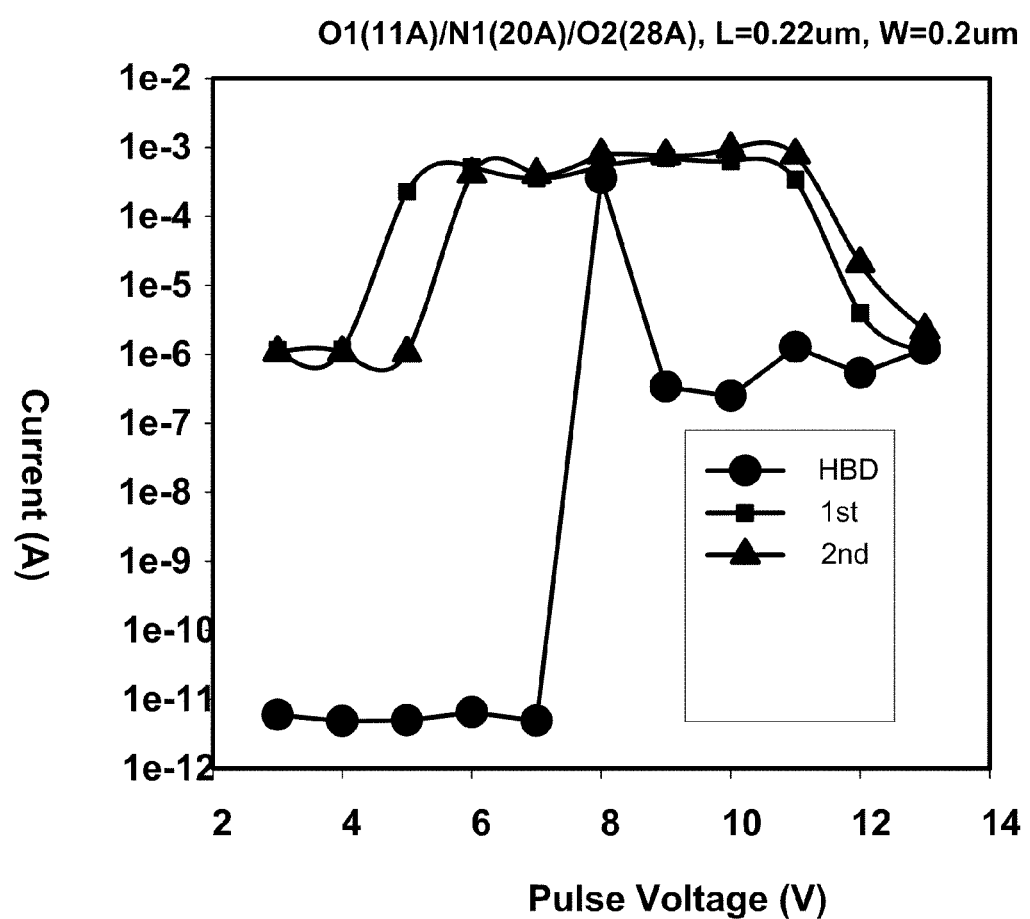

FIGS. 16-18 is a graph of the hard breakdown, reset, and set operations on the diode memory device of FIG. 15.

The pulse width of each Vg pulse is 100 ns.

Figure 19:
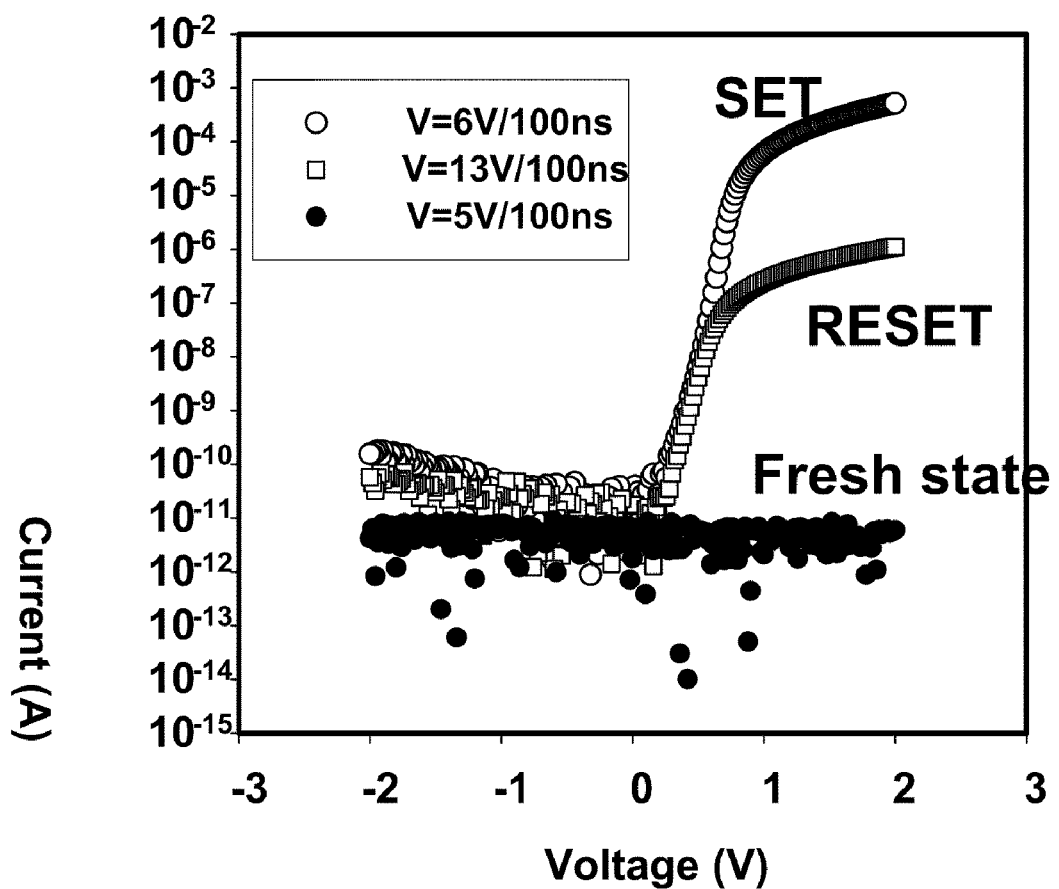
FIG. 19 is a graph of I-V characteristics of the different states of the diode memory device of FIG. 15.

FIG. 19 is a graph of I-V characteristics of the different states of the diode memory device of FIG. 15.

Figure 20:
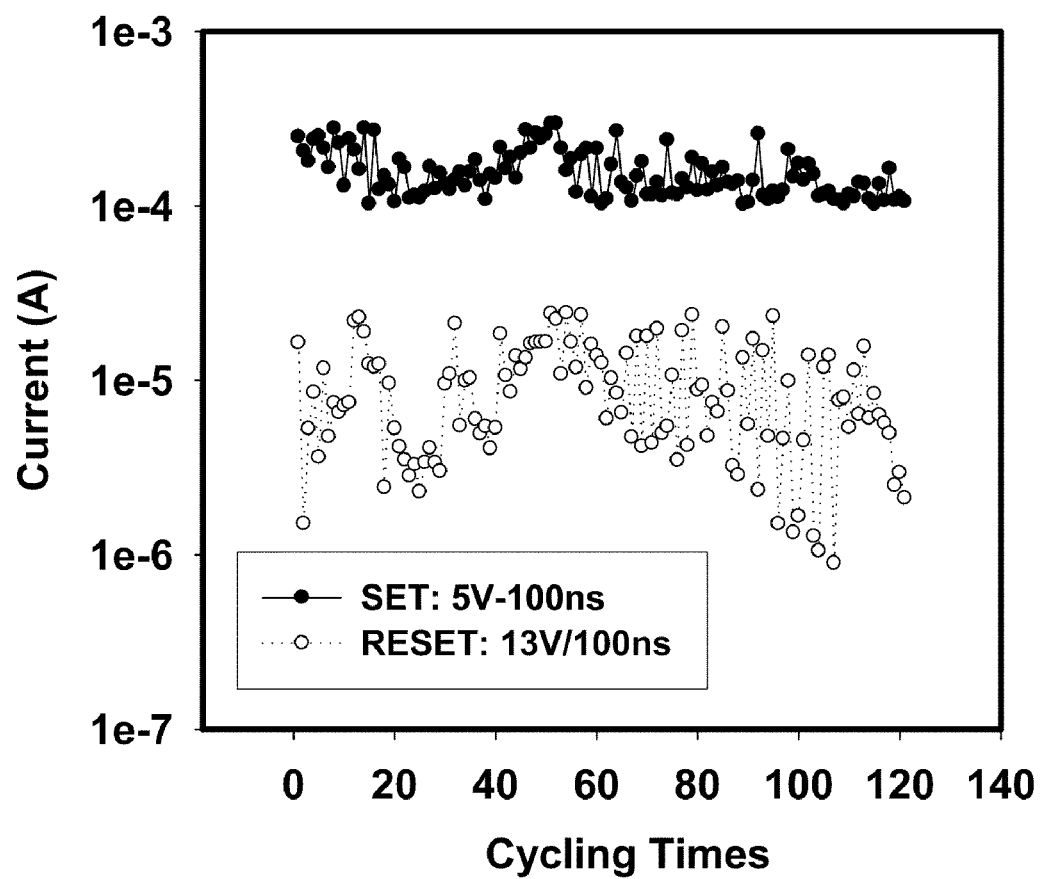
FIG. 20 is a graph showing cycling of the diode memory device of FIG. 15.

FIG. 20 is a graph showing cycling of the diode memory device of FIG. 15.

Each state is extracted at Vg=2V.

Figure 21:
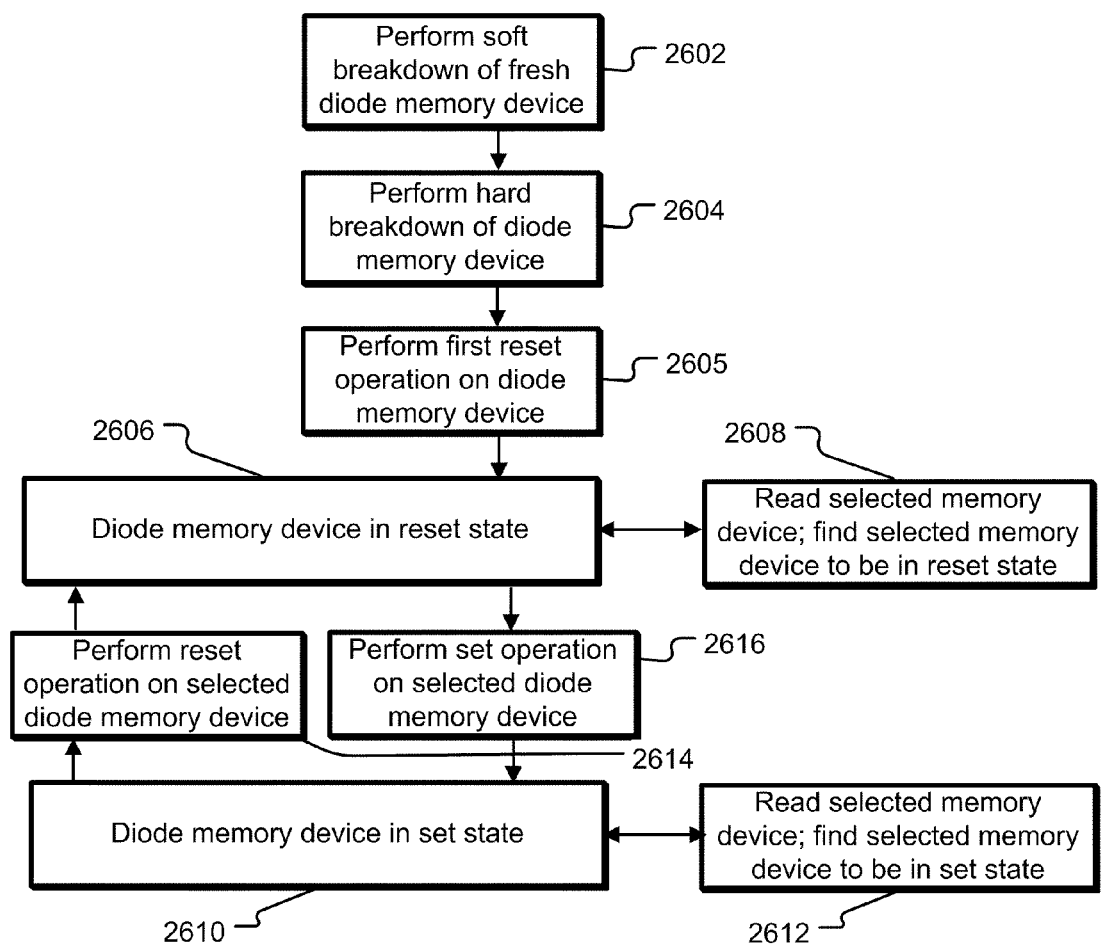
FIG. 21 is a flowchart showing operation of the diode memory device.

FIG. 21 is a flowchart showing operation of the diode memory device.

In 2602, soft breakdown is performed on a fresh diode memory device. In 2604, hard breakdown is performed on the diode memory device. In 2605, the first reset operation is performed on the diode memory device, placing the diode memory device in the reset state. The preceding steps are associated with preparing a newly manufactured diode memory device, prior to ordinary use by an end user.

The following steps are associated with ordinary operation of a diode memory device, such as by an end user. In 2606, the diode memory device is in a reset state. In 2616, a set operation is performed on a diode memory device, selected by X-Y addressing of a particular diode memory device in a cross-point array, for example. In 2610, the diode memory device is in a set state. Multiple diode memory devices can be addressed at one time. In 2614, a reset operation is performed on a diode memory device, selected by X-Y addressing of a particular diode memory device in a cross-point array, for example. Multiple diode memory devices can be addressed at one time. Again in 2606, the diode memory device is in a reset state.

During ordinary operation, read operations are performed on the diode memory device. In 2608, a read operation is performed on a selected diode memory device in a reset state (2606). The diode memory device is selected by X-Y addressing of a particular diode memory device in a cross-point array, for example. In 2612, a read operation is performed on a selected diode memory device in a set state (2610). The diode memory device is selected by X-Y addressing of a particular diode memory device in a cross-point array, for example.

Figure 22:
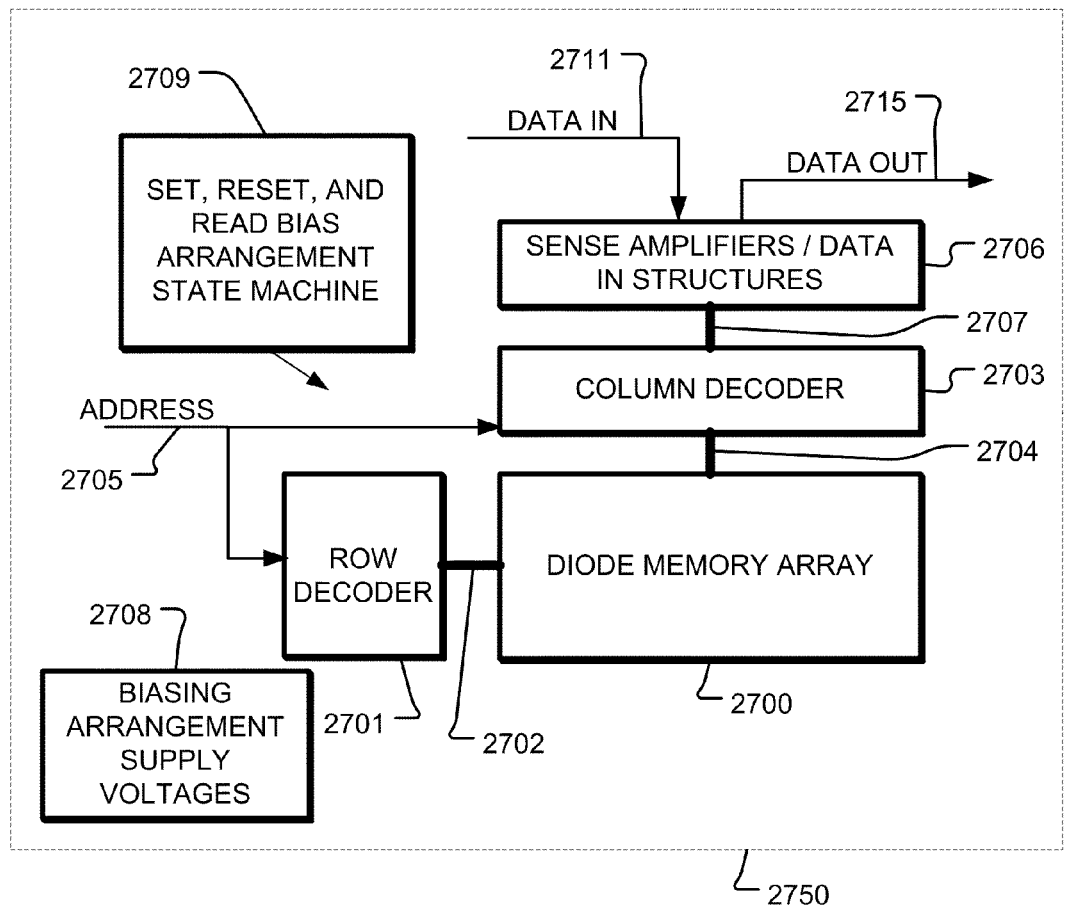
FIG. 22 is a block diagram of an integrated circuit with an array of diode memory devices and control logic to apply operations on selected diode memory devices such as read, set, and reset operations.

FIG. 22 is a block diagram of an integrated circuit with an array of diode memory devices and control logic to apply operations on selected diode memory devices such as read, set, and reset operations.

FIG. 22 shows an integrated circuit 2750 including a diode memory array 2700. A word line and block select decoder 2701 is coupled to, and in electrical communication with, a plurality 2702 of word lines, and arranged along rows in the diode memory array 2700. A bit line decoder and drivers 2703 are coupled to and in electrical communication with a plurality of bit lines 2704 arranged along columns in the memory diode array 2700 for reading data from, and writing data to, the diode memory cells in the diode memory array 2700. Addresses are supplied on bus 2705 to the word line decoder and drivers 2701 and to the bit line decoder 2703. Sense amplifiers and data-in structures in block 2706, including current sources for the read, program and erase modes, are coupled to the bit line decoder 2703 via the bus 2707. Data is supplied via the data-in line 2711 from input/output ports on the integrated circuit 2750, to the data-in structures in block 2706. Data is supplied via the data-out line 2715 from the sense amplifiers in block 2706 to input/output ports on the integrated circuit 2750, or to other data destinations internal or external to the integrated circuit 2750. A set, reset, and read bias arrangement state machine is in circuitry 2709, controlling biasing arrangement supply voltages 2708. The bias arrangements bidirectionally switch the states of a diode memory device's memory element, such as between SET and RESET.

Figure 23:
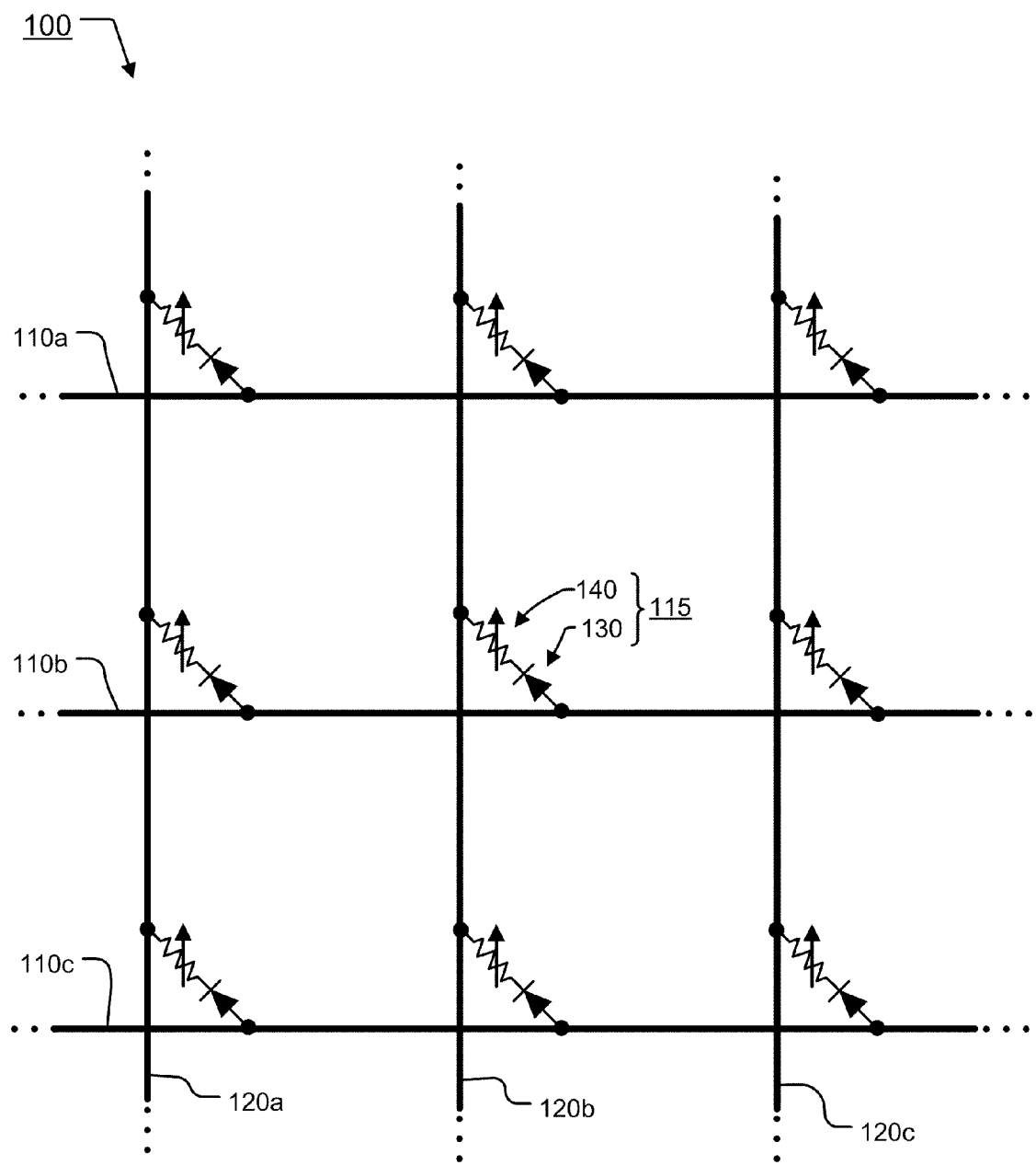
FIG. 23 illustrates a schematic diagram of a portion of a cross-point memory array implemented using diode memory cells as described herein.

FIG. 23 illustrates a schematic diagram of a portion of a cross-point memory array implemented using diode memory cells as described herein.

As shown in the schematic diagram of FIG. 23, each of the memory cells of the array 100 is a diode memory device, represented as a diode access device in series with a resistive memory element (represented in FIG. 23 by a variable resistor) along a current path between a corresponding word line 110 and a corresponding bit line 120. As described in more detail below, the diode memory device is programmable to plurality of states.

The array comprises a plurality of word lines 110 including word lines 110*a*, 110*b*, and 110*c* extending in parallel in a first direction, and a plurality of bit lines 120 including bit lines 120*a*, 120*b*, and 120*c* extending in parallel in a second direction perpendicular to the first direction. The array 100 is referred to as a cross-point array because the word lines 110 and bit lines 120 cross each other but do not physically intersect, and the diode memory cells are located at these cross-point locations of the word lines 110 and bit lines 120.

Diode memory cell 115 is representative of the memory cells of array 100 and is arranged at the cross-point location of the word line 110*b* and the bit line 120*b*, the diode memory cell 115 represented as a diode 130 and a variable resistor 140 arranged in series. The diode memory device 115 is electrically coupled to the word line 110*b* and electrically coupled to the bit line 120*b*.

Reading or writing (set/reset) to diode memory cell 115 of array 100 can be achieved by applying appropriate voltage pulses to the corresponding word line 110*b* and bit line 120*b* to induce a current through the selected memory cell 115. The level and duration of the voltages applied is dependent upon the operation performed, e.g. a reading operation or a programming operation (set/reset).

In a read (or sense) operation of the data value stored in the memory cell 115, bias circuitry coupled to the corresponding word line 110*b* and bit line 120*b* to applies bias arrangements across the memory cell 115 of suitable amplitude and duration to induce current to flow which does not result in the memory element 140 undergoing a change in state. The current through the memory cell 115 is dependent upon the resistance and thus the data value of the diode memory device 115. The data value may be determined, for example, by comparison of the current on the bit line 120*b* with a suitable reference current by sense amplifiers (for example, sense amplifiers/data in structures). Current through unselected diode memory devices is reduced or substantially eliminated by the diode in the unselected diode memory devices.

In a program operation of a data value to be stored in the diode memory device 115, bias circuitry (for example, biasing arrangement supply voltages) coupled to the corresponding word line 110*b* and bit line 120*b* to apply bias arrangements across the memory cell 115 of suitable amplitude and duration to induce a programmable change (set/reset) to store the data value in the memory cell 115.

The bias arrangements include a first bias arrangement sufficient to forward bias the diode 130 and change the state of the diode memory device from a first programmed state to a second programmed state. The bias arrangements also include a second bias arrangement sufficient to forward bias the diode memory device and change the second programmed state to a first programmed state. In embodiments the bias arrangements for unipolar operation of the memory element 140 may each comprise one or more voltage pulses, and the voltage levels and pulse times can be determined empirically for each embodiment.

Embodiments of an intermediate structure of the diode memory cells described herein include phase change based memory materials, including chalcogenide based materials and other materials. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as Te$_a$Ge$_b$Sb$_{100-(a+}$ b). One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include Ge2Sb2Te5, GeSb2Te4 and GeSb4Te7 (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is Ge2Sb2Te5.

Other programmable resistive memory materials may be used in other embodiments of an intermediate structure of the diode memory cells, including other materials that use different crystal phase changes to determine resistance, or other memory materials that use an electrical pulse to change the resistance state. Examples include materials for use in resistance random access memory (RRAM) such as metal-oxides including tungsten-oxide (WOx), NiO, Nb2O5, CuO2, Ta2O5, Al2O3, CoO, Fe2O3, HfO2, TiO2, SrTiO3, SrZrO3, (BaSr)TiO3. Additional examples include materials for use in magnetoresistance random access memory (MRAM) such as spin-torque-transfer (STT) MRAM, for example at least one of CoFeB, Fe, Co, Ni, Gd, Dy, CoFe, NiFe, MnAs, MnBi, MnSb, CrO2, MnOFe2O3, FeOFe2O5, NiOFe2O3, MgOFe2, EuO, and Y3Fe5O12. See, for example, US Publication No 2007/0176251 entitled "Magnetic Memory Device and Method of Fabricating the Same", which is incorporated by reference herein. Additional examples include solid electrolyte materials used for programmable-metallization-cell (PMC) memory, or nano-ionic memory, such as silver-doped germanium sulfide electrolytes and copper-doped germanium sulfide electrolytes. See, for example, N. E. Gilbert et al., "A macro model of programmable metallization cell devices," Solid-State Electronics 49 (2005) 1813-1819, which is incorporated by reference herein.

An exemplary method for forming chalcogenide material uses PVD-sputtering or magnetron-sputtering method with source gas(es) of Ar, N2, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimator can be used simultaneously. An exemplary method for forming chalcogenide material using chemical vapor deposition (CVD) is disclosed in US Publication No 2006/0172067 entitled "Chemical Vapor Deposition of Chalcogenide Materials", which is incorporated by reference herein. Another exemplary method for forming chalcogenide material using CVD is disclosed in Lee, et al., "Highly Scalable Phase Change Memory with CVD GeSbTe for Sub 50 nm Generation, 2007 Symposium on VLSI Technology Digest of Technical Papers, pp. 102-103.

A post-deposition annealing treatment in a vacuum or in an N2 ambient is optionally performed to improve the crystallize state of chalcogenide material. The annealing temperature typically ranges from 100° C. to 400° C. with an anneal time of less than 30 minutes.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit apparatus, comprising:
   a cross-point array including a plurality of bit lines and a plurality of word lines, intersections of the plurality of bit lines and the plurality of word lines including diode memory devices, the diode memory devices including:
　a diode including a first terminal electrically coupling a bit line of the plurality of bit lines and a second terminal electrically coupling a word line of the plurality of word lines; and
　a memory element between the first terminal and the second terminal of the diode, the memory element being bidirectionally switchable between a first memory state and a second memory state,
wherein the diodes of the diode memory devices reduce current through unselected intersections of the intersections of the plurality of bit lines and the plurality of word lines; and
control circuitry coupled to the cross-point array, the control circuitry applying bias arrangements to a selected intersection of the intersections of the plurality of bit lines and the plurality of word lines that bidirectionally switch the memory element of the diode memory device at the selected intersection.

2. The apparatus of claim 1, wherein the first terminal is in a doped well and the second terminal is part of the word line.

3. The apparatus of claim 1, wherein the first terminal is in a well having a first doping type at a first concentration, and the second terminal is part of the word line, and the diode memory device further includes:
　a doping region having the first doping type in the well, the doping region positioned under the memory element and having a second concentration less than the first concentration.

4. The apparatus of claim 1, wherein the memory element includes silicon oxide.

5. The apparatus of claim 1, wherein the memory element includes a first silicon oxide layer, a silicon nitride layer over the first silicon oxide layer, and a second silicon oxide layer over the silicon nitride layer.

6. The apparatus of claim 1, wherein the memory element includes any of a metal oxide, silicon nitride, silicon oxynitride, programmable resistive material, and a material with a dielectric constant larger than a silicon oxide dielectric constant.

7. The apparatus of claim 1, wherein the diode memory devices further include at least one of:
　an upper buffer layer between the first terminal and the memory element; and
　a lower buffer layer between the second terminal and the memory element.

8. The apparatus of claim 1, wherein the control circuitry applies a first forward bias arrangement with a first set of electrical characteristics to the selected intersection that switches the memory element of the diode memory device at the selected intersection from the first memory state to the second memory state, and
　wherein the control circuitry applies a second forward bias arrangement with a second set of electrical characteristics to the selected intersection that switches the memory element of the diode memory device at the selected intersection from the second memory state to the first memory state.

9. The apparatus of claim 1, wherein the control circuitry switches the memory element of the diode memory device at the selected intersection from the first memory state to the second memory state by causing dielectric breakdown induced epitaxy at the memory element, and
　wherein the control circuitry switches the memory element of the diode memory device at the selected intersection from the second memory state to the first memory state by causing Joule heating at the memory element.

10. The apparatus of claim 1, wherein the first memory state corresponds to the diode memory device having a first diode current-voltage characteristic, and the second memory state corresponds to the diode memory device having a second diode current-voltage characteristic, wherein the first diode current-voltage characteristic and the second diode current-voltage characteristic have different forward characteristics.

11. The apparatus of claim 1, wherein the memory element is switchable between at least four memory states including the first memory state and the second memory state.

12. A method of operating an integrated circuit, comprising:
　applying bias arrangements to a selected intersection of intersections of a plurality of bit lines and a plurality of word lines that bidirectionally switch memory states of a memory element of a diode memory device at the selected intersection, wherein the diode memory device includes a diode including a first terminal electrically coupling a bit line of the plurality of bit lines and a second terminal electrically coupling a word line of the plurality of word lines, and a memory element between the first terminal and the second terminal of the diode, and current through unselected intersections of the intersections of the plurality of bit lines and the plurality of word lines is reduced by the diode of the diode memory device at the unselected intersections.

13. The method of claim 12, comprising:
　prior to regular operation of the diode memory device, applying an initial bias arrangement to the diode memory device that changes the memory element from an unused state to one of the memory states.

14. The method of claim 12, comprising:
　prior to regular operation of the diode memory device, applying an initial bias arrangement to the diode memory device that changes the memory element from an unused state having a non-diode current-voltage characteristic to one of the memory states having a diode current-voltage characteristic.

15. The method of claim 12, wherein said applying bias arrangements includes:
　applying a first forward bias arrangement with a first set of electrical characteristics to the selected intersection that switches the memory element of the diode memory device at the selected intersection from a first memory state to a second memory state, and
　applying a second forward bias arrangement with a second set of electrical characteristics to the selected intersection that switches the memory element of the diode memory device at the selected intersection from the second memory state to the first memory state.

16. The method of claim 12, wherein said applying bias arrangements includes:
　switching the memory element of the diode memory device at the selected intersection from a first memory state to a second memory state by causing dielectric breakdown induced epitaxy at the memory element, and
　switching the memory element of the diode memory device at the selected intersection from the second memory state to the first memory state by causing Joule heating at the memory element.

17. The method of claim 12, wherein the first memory state corresponds to the diode memory device having a first diode current-voltage characteristic, and the second memory state corresponds to the diode memory device having a second diode current-voltage characteristic, wherein the first diode current-voltage characteristic and the second diode current-voltage characteristic have different forward characteristics.

18. The method of claim 12, wherein said applying bias arrangements switch the memory element among between memory states having different diode current-voltage characteristics.

19. The method of claim 12, wherein said applying bias arrangements switch the memory element among at least four memory states.

20. An integrated circuit apparatus, comprising:
a diode memory device including:
a diode including a first terminal and a second terminal; and
a memory element between the first terminal and the second terminal of the diode, the memory element being bidirectionally switchable between a first memory state and a second memory state,
wherein the first terminal is in a well having a first doping type at a first concentration, a doping region having the first doping type in the well and having a second concentration less than the first concentration.
control circuitry coupled to the diode memory device, the control circuitry applying bias arrangements to the diode memory device that bidirectionally switch the memory element of the diode memory device.

* * * * *